US 8,149,974 B2

(12) United States Patent
Arima et al.

(10) Patent No.: US 8,149,974 B2
(45) Date of Patent: *Apr. 3, 2012

(54) PHASE COMPARATOR, PHASE COMPARISON DEVICE, AND CLOCK DATA RECOVERY SYSTEM

(75) Inventors: Yukio Arima, Osaka (JP); Akinori Shinmyo, Osaka (JP); Toru Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 572 days.

This patent is subject to a terminal disclaimer.

(21) Appl. No.: 12/374,743

(22) PCT Filed: Nov. 15, 2006

(86) PCT No.: PCT/JP2006/322761
§ 371 (c)(1),
(2), (4) Date: Jan. 22, 2009

(87) PCT Pub. No.: WO2008/012928
PCT Pub. Date: Jan. 31, 2008

(65) Prior Publication Data
US 2010/0002822 A1    Jan. 7, 2010

(30) Foreign Application Priority Data
Jul. 28, 2006  (JP) .................... 2006-206227

(51) Int. Cl.
*H04L 7/00* (2006.01)
(52) U.S. Cl. ........................ 375/355; 375/375
(58) Field of Classification Search ............ 375/350, 375/355, 371, 375, 376, 373
See application file for complete search history.

(56) References Cited

U.S. PATENT DOCUMENTS

| | | | |
|---|---|---|---|
| 5,905,769 A | 5/1999 | Lee et al. | |
| 6,031,886 A * | 2/2000 | Nah et al. | 375/375 |
| 6,611,219 B1 * | 8/2003 | Chen et al. | 341/141 |
| 6,856,658 B1 * | 2/2005 | Baba et al. | 375/355 |
| 7,050,522 B2 * | 5/2006 | Schmatz | 375/371 |
| 7,970,092 B2 * | 6/2011 | Arima et al. | 375/376 |
| 2002/0154723 A1 * | 10/2002 | Nakamura | 375/376 |
| 2002/0176527 A1 * | 11/2002 | Nakamura | 375/376 |
| 2003/0161427 A1 | 8/2003 | Nonaka | |
| 2004/0036087 A1 * | 2/2004 | Okamura | 257/202 |
| 2004/0114632 A1 | 6/2004 | Yuuki et al. | |
| 2005/0084050 A1 * | 4/2005 | Cheung et al. | 375/375 |
| 2009/0122939 A1 * | 5/2009 | Hoang et al. | 375/375 |
| 2009/0123160 A1 * | 5/2009 | Yajima et al. | 398/154 |
| 2009/0257542 A1 * | 10/2009 | Evans et al. | 375/375 |

FOREIGN PATENT DOCUMENTS

JP    10-247903    9/1998

* cited by examiner

*Primary Examiner* — Emmanuel Bayard
(74) *Attorney, Agent, or Firm* — McDermott Will & Emery LLP

(57) ABSTRACT

A comparison period detecting unit (11) defines, as a comparison period, a period between a rising edge of a first clock signal and a rising edge of a second clock signal, and detects the presence or absence of transition of a data signal during the comparison period. A phase relationship detecting unit (12) detects a phase relationship between the data signal and a reference clock signal, and outputs a result of detection of the phase relationship when the comparison period detecting unit (11) detects transition of the data signal during the comparison period.

22 Claims, 22 Drawing Sheets

PHASE COMPARATOR, PHASE COMPARISON DEVICE, AND CLOCK DATA RECOVERY SYSTEM

RELATED APPLICATIONS

This application is the US National Phase under 35 U.S.C. §371 of International Application No. PCT/JP2006/322761 filed on Nov. 15, 2006, which claims the benefit of Japanese Application No. JP 2006-206227 filed on Jul. 28, 2006, the disclosures of which Applications are incorporated by reference herein.

TECHNICAL FIELD

The present invention relates to a phase adjusting technique of synchronizing a clock signal with received data in data communication.

BACKGROUND ART

When data communication is performed between apparatuses, since a receiver apparatus and a transmitter apparatus have asynchronous clocks and, in addition, different clock frequencies due to different operating environments (e.g., power supply noise, temperature, etc.), the receiver apparatus needs to reproduce clocks based on received data. This process is generally called timing recovery, data clock recovery or the like. In general timing recovery, clocks are generated in a receiver, a phase difference between the clocks and received data is detected, and the frequency or phase of the clocks is adjusted, depending on the detected phase difference, which steps are repeatedly performed.

FIG. 24 shows a general phase difference detecting means. A data detecting means 161 and a clock detecting means 162 are flip-flops, in which their data pins are fixed to the "H level", and a data signal and a clock signal are input to their clock pins, respectively, and a reset signal output from a determination means 163 is input to their reset pins. When the data signal goes to the "H level", the output of the data detecting means 161 goes to the "H level" and is then output as an UP signal. Similarly, when the clock signal goes to the "H level", the output of the clock detecting means 162 goes to the "H level" and is then output as a DOWN signal. The determination means 163 monitors the output of the data detecting means 161 and the output of the clock detecting means 162, and when both of the outputs go to the "H level", outputs a reset signal. In other words, the output of the data detecting means 161 and the output of the clock detecting means 162, when both go to the "H level", are reset to the "L level". Therefore, when the data signal arrives earlier than the clock signal, the "UP signal" is output for the same period as the phase difference. In the opposite situation, the "DOWN signal" is output for the same period as the phase difference. Thereby, it is possible to detect how much the phase of the clock signal is advanced or delayed from the data signal.

The phase difference detection by such a method can be achieved by a simple circuit. However, as the data rate is increased, the pulse width of the UP signal and the DOWN signal decreases, so that full swing cannot be performed, and therefore, it becomes more difficult to correctly detect a phase difference. To solve such a problem, methods of determining a phase using the result of oversampling of received data are disclosed in U.S. Pat. No. 5,905,769 (Patent Document 1) and Japanese Unexamined Patent Application Publication No. 2004-180188 (Patent Document 2).

Patent Document 1 discloses a phase comparator that latches four bits of received data using a clock signal having twelve phases. Specifically, a phase comparison process in which three-times oversampling is executed with respect to one bit of received data is performed for four bits in parallel. Three-times oversampling means that received data having a one-bit width of "T" is held at periods of "T/3" three times. Thus, based on a result from latching one bit of received data a plurality of times at different timings, a phase relationship between received data and a clock signal can be found. For example, when three-times oversampling is executed near a time when received data is transitioned in a manner that "0→1→0→ . . . " (near a data transition point), then if the phase relationship between received data and a clock signal is in a desired state (ideal phase relationship), "(000)(111)(000) . . . " is obtained. However, when the latched result is "(001)(110)(001) . . . ", it can be determined that the phase of the clock signal is delayed from the received data. Conversely, when the latched result is "(100)(011)(100) . . . ", it can be determined the phase of the clock signal is advanced from the received data.

Patent Document 2 discloses a phase detecting circuit in which an effect equivalent to oversampling is obtained by delaying received data instead of using multi-phase clocks. FIG. 25 shows a configuration of a phase comparator disclosed in Patent Document 2. Here, two delay elements 171 are used to delay received data in two steps, and two outputs of the delay elements 171 and non-delayed data (i.e., three pieces of data) are latched in synchronization with a clock signal from a frequency divider 172. As in Patent Document 1, the latched result is 3-bit information, such as (001), and based on the result, a phase delay signal or a phase advance signal is output.

Here, the phase comparator of Patent Document 2, when a delay amount of each delay element 171 is "T/3", performs an operation similar to that of the phase comparator disclosed in Patent Document 1. However, when the delay amount is "less than T/3", a "dead zone" occurs in which phase determination is not performed. For the sake of simplicity, the SETUP/HOLD time of a flip-flop is assumed to be "0" and the delay amount of the delay element 171 is assumed to be "D". In this case, a phase delay signal or a phase advance signal is output only when a data transition point occurs during a period from a rising edge of the clock signal to a point in time that is a period corresponding to a delay amount of 2D before the rising edge of the clock signal. In other words, when a data transition point occurs during a period from a "rising edge of a clock signal one cycle before" to a "point in time that is a period corresponding to a delay amount of 2D before the next rising edge", phase determination is not performed. Thus, this period is a dead zone.

In the phase comparators shown in Patent Document 1 and FIG. 25 (Patent Document 2), only a phase relationship between received data and a clock signal is determined, so that even when the communication speed of data is increased, a problem that a pulse indicating the phase difference is distorted does not arise, for example. Also, since the output result is in a digital form, pipelined or parallel processing can be easily performed, resulting in a circuit configuration suitable for high-speed communication.

Patent Document 1: U.S. Pat. No. 5,905,769
Patent Document 2: Japanese Unexamined Patent Application Publication No. 2004-180188

DISCLOSURE OF THE INVENTION

Problems to be Solved by the Invention

However, in the configuration of FIG. 25, the accuracy of a delay element has a significant influence on the operation. In general, a delay element includes a gate delay of an inverter or the like, and is easily affected by, for example, the fluctuation of a power supply voltage or temperature, and therefore, is difficult to achieve a highly accurate delay. A constant delay amount can be achieved by compensating for the fluctuation of temperature, but in this case, a relatively large analog circuit is required, resulting in a large area of the phase detecting circuit. In addition, in the case of communication in which a data rate varies (e.g., the HDMI), a plurality of delay elements need to be prepared so as to achieve optimal delay amounts corresponding to possible data rates, leading to an increase in area and power.

Also, in the phase comparator disclosed in Patent Document 1, the number of required phases of a clock signal increases in proportion to an increase in the number of times of oversampling and an increase in the number of bits that are processed in parallel. For example, a 16-phase clock signal is required to achieve four-times oversampling with respect to four bits of a data signal, and a 25-phase clock signal is required to achieve five-times oversampling with respect to five bits of a data signal. Thus, a clock signal having a number of phases corresponding to the number of times of oversampling needs to be distributed to each phase detecting circuit that performs a process corresponding to one bit, resulting in an increase in wiring area, and therefore, an increase in power required for clock transmission. Also, a clock skew variation due to cross-coupling between wiring lines or the like, or a signal deterioration due to crosstalk occurs.

Therefore, an object of the present invention is to achieve a stable phase comparison process against the fluctuation of a power supply voltage or temperature. Another object of the present invention is to suppress an increase in the number of phases of a clock signal (or the number of clock signals) required for a phase comparison process.

Solution to the Problems

According to an aspect of the present invention, a phase comparator includes a comparison period detecting unit and a phase relationship detecting unit. The comparison period detecting unit receives a data signal, a first clock signal, and a second clock signal, and defines, as a comparison period, a period between a rising edge of the first clock signal and a rising edge of the second clock signal. The comparison period detecting unit detects the presence or absence of transition of the data signal during the comparison period. Data has a one-bit length of T. The first clock signal has a period of nT (n is an integer of 2 or more). The second clock signal has a period of nT and a phase delayed by h ($0 < h \leq 1$ T) from the first clock signal. The phase relationship detecting unit receives the data signal, and a reference clock signal. The phase relationship detecting unit detects a phase relationship between the data signal and the reference clock signal, and outputs a result of detection of the phase relationship when transition of the data signal is detected by the comparison period detecting unit during the comparison period. The reference clock signal has a period of nT and a phase delayed by i ($0 < i < h$) from the first clock signal.

In the phase comparator, the phase comparison process and the detection of the presence or absence of transition of a data signal during a comparison period are executed in parallel, and the result of detection of a phase relationship is output when transition of the data signal is detected. With this configuration, the phase comparator does not need to include a delay element, so that a phase comparison process that is stable against the fluctuation of a power supply voltage and temperature can be achieved. Also, when a plurality of phase comparators are used to perform a phase comparison process with respect to a plurality of bits of the data signal, the number of clock signals required for the phase comparison process can be reduced as compared to an example of conventional four or more times oversampling. Moreover, the second clock signal supplied to the p-th (p is an integer, $1 \leq p \leq n$) phase comparator and the first clock signal supplied to the q-th (q is an integer, $q=p+1$ if $1 \leq p \leq n-1$ and $q=1$ if $p=n$) phase comparator can be caused to be the same, so that the number of required clock signals can be further reduced. Thus, a limited number of clock signals only need to be distributed, so that an increase in wiring area and an increase in power required for clock transmission can be suppressed, and a clock skew variation due to cross-coupling between wiring lines or the like, or a signal deterioration due to crosstalk, can be reduced.

Preferably, the second clock signal has a phase delayed by 1 T from the first clock signal and is a clock indicating a timing at which the data signal is latched. The phase relationship detecting unit includes a phase delay detecting unit and a phase advance detecting unit. The phase delay detecting unit outputs a phase delay signal when a rising edge of the reference clock signal occurs in time after transition of the data signal and transition of the data signal is detected by the comparison period detecting unit during the comparison period. The phase advance detecting unit outputs a phase advance signal when a rising edge of the reference clock signal occurs in time before transition of the data signal and transition of the data signal is detected by the comparison period detecting unit during the comparison period.

In the phase comparator, a phase delay signal is output when a reference clock signal is delayed from a data signal, and a phase advance signal is output when a reference clock signal is advanced from a data signal. Thus, the phase delay signal and the phase advance signal are output as a result of detection of a phase relationship. By referencing the result of detection of a phase relationship, a rising edge of a reference clock signal can be caused to be closer to a transition point of a data signal. Thereby, a rising edge of the second clock signal that is a latch clock can be provided in a middle portion between transition points of a data signal.

Preferably, the phase delay detecting unit includes a first holding unit for holding an inverted signal of the reference clock signal in synchronization with transition of the data signal, and a phase delay signal output unit for outputting a result held by the first holding unit as the phase delay signal when transition of the data signal is detected by the comparison period detecting unit during the comparison period. The phase advance detecting unit includes a second holding unit for holding the reference clock signal in synchronization with transition of the data signal, and a phase advance signal output unit for outputting a result held by the second holding unit as the phase advance signal when transition of the data signal is detected by the comparison period detecting unit during the comparison period.

In the phase comparator, for example, a result held by the first holding unit goes to the "H level" when a rising edge of a reference clock signal occurs in time after transition of a data signal, and a result held by the second holding unit goes to the "H level" when a rising edge of a reference clock signal occurs in time before transition of a data signal.

Preferably, the phase delay detecting unit includes a transition point detecting unit for detecting transition of the data signal, a first output unit for outputting a first internal signal, depending on a timing at which transition of the data signal is detected by the transition point detecting unit, and a phase delay signal output unit for outputting the phase delay signal when the first output unit outputs the first internal signal and the comparison period detecting unit detects transition of the data signal during the comparison period. The phase advance detecting unit includes a reference point detecting unit for detecting a rising edge of the reference clock signal, a second output unit for outputting a second internal signal, depending on a timing at which a rising edge of the reference clock signal is detected by the reference point detecting unit, and a phase advance signal output unit for outputting the phase advance signal when the second output unit outputs the second internal signal and the comparison period detecting unit detects transition of the data signal during the comparison period. The first output unit outputs the first internal signal when the transition point detecting unit detects transition of the data signal in time before the reference point detecting unit detects a rising edge of the reference clock signal. The second output unit outputs the second internal signal when the transition point detecting unit detects transition of the data signal in time after the reference point detecting unit detects a rising edge of the reference clock signal.

Also, preferably, the second clock signal has a phase delayed by 1 T from the first clock signal and is a clock indicating a timing at which the data signal is latched. The phase relationship detecting unit includes a phase delay detecting unit and a phase advance detecting unit. The phase delay detecting unit outputs a phase delay signal when a rising edge of the reference clock occurs in time after transition of the data signal and the comparison period detecting unit detects transition of the data signal during the comparison period. The phase advance detecting unit outputs a phase advance signal when a rising edge of a delayed reference clock signal occurs in time before transition of the data signal and the comparison period detecting unit detects transition of the data signal during the comparison period. The delayed reference clock signal has a phase delayed by D ($0<D<1$ T-i) from the reference clock signal.

In the phase comparator, the result of detection of a phase relationship is not output even when transition of a data signal occurs during a period from when a rising edge of a reference clock signal occurs to when a rising edge of a delayed reference clock signal occurs. In other words, this period is a dead zone. Thus, by forming the dead zone, robustness against noise, such as jitter or the like, can be improved.

Preferably, the phase delay detecting unit includes a first holding unit for holding an inverted signal of the reference clock signal in synchronization with transition of the data signal, and a phase delay signal output unit for outputting a result held by the first holding unit as the phase delay signal when the comparison period detecting unit detects transition of the data signal during the comparison period. The phase advance detecting unit includes a second holding unit for holding the delayed reference clock signal in synchronization with transition of the data signal, and a phase advance signal output unit for outputting a result held by the second holding unit as the phase advance signal when the comparison period detecting unit detects transition of the data signal during the comparison period.

In the phase comparator, for example, a result held by the first holding unit goes to the "H level" when a rising edge of a reference clock signal occurs in time after transition of a data signal, and a result held by the second holding unit goes to the "H level" when a rising edge of a delayed reference clock signal occurs in time before transition of a data signal.

Preferably, the phase delay detecting unit includes a reference point detecting unit for detecting a rising edge of the reference clock signal, a transition point detecting unit for detecting transition of the data signal, a first output unit for outputting a first internal signal when the transition point detecting unit detects transition of a data signal in time before the reference point detecting unit detects a rising edge of the reference clock signal, and a phase delay signal output unit for outputting the phase delay signal when the first output unit outputs the first internal signal and the comparison period detecting unit detects transition of the data signal during the comparison period. The phase advance detecting unit includes a delayed reference point detecting unit for detecting a rising edge of the delayed reference clock signal, a second output unit for outputting a second internal signal when the delayed reference point detecting unit detects a rising edge of the delayed reference clock signal in time before the transition point detecting unit detects transition of the data signal, and a phase advance signal output unit for outputting the phase advance signal when the second output unit outputs the second internal signal and the comparison period detecting unit detects transition of the data signal during the comparison period.

Also, preferably, the second clock signal has a phase delayed by 1 T from the first clock signal and is a clock indicating a timing at which the data signal is latched. The phase relationship detecting unit includes a phase delay detecting unit and a phase advance detecting unit. The phase delay detecting unit outputs a phase delay signal when a rising edge of the reference clock signal occurs in time after transition of a delayed data signal and the comparison period detecting unit detects transition of the data signal during the comparison period. The delayed data signal is delayed by D ($0<D<i$) from the data signal. The phase advance detecting unit outputs a phase advance signal when a rising edge of the reference clock signal occurs in time before transition of the data signal and the comparison period detecting unit detects transition of the data signal during the comparison period.

In the phase comparator, the result of detection of a phase relationship is not output even when a rising edge of a reference clock signal occurs during a period from a transition point of a data signal to a transition point of a delayed data signal. In other words, a period from a rising edge of the reference clock signal to a point in time that is a period corresponding to a delay amount of the delayed data signal before is a dead zone.

Preferably, the phase delay detecting unit includes a first holding unit for holding an inverted signal of the reference clock signal in synchronization with transition of the data signal, a delay holding unit for holding the inverted signal of the reference clock signal in synchronization with transition of the delayed data signal, a first output unit for outputting a logical AND of results held by the first holding unit and the delay holding unit, and a phase delay signal output unit for outputting the output of the first output unit as the phase delay signal when the comparison period detecting unit detects transition of the data signal during the comparison period. The phase advance detecting unit includes a second holding unit for holding the reference clock signal in synchronization with transition of the data signal, and a phase advance signal output unit for outputting a result held by the second holding unit as the phase advance signal when the comparison period detecting unit detects transition of the data signal during the comparison period.

In the phase comparator, for example, a result held by the first holding unit goes to the "H level" when a rising edge of a reference clock signal occurs in time after transition of a delayed data signal, and a result held by the second holding unit goes to the "H level" when a rising edge of a reference clock signal occurs in time before transition of a data signal.

Preferably, the phase delay detecting unit includes a reference point detecting unit for detecting a rising edge of the reference clock signal, a transition point detecting unit for detecting transition of the data signal, a delayed transition point detecting unit for detecting transition of the delayed data signal, a phase delay predicting unit for outputting a phase delay prediction signal when the transition point detecting unit detects transition of the data signal in time before the reference point detecting unit detects a rising edge of the reference clock signal, a first output unit for outputting a first internal signal when the delayed transition point detecting unit detects transition of the delayed data signal in time before the reference point detecting unit detects a rising edge of the reference clock signal, and a phase delay signal output unit for outputting the phase delay signal when the phase delay predicting unit outputs a phase delay prediction signal, the first output unit outputs the first internal signal, and the comparison period detecting unit detects transition of the data signal during the comparison period. The phase advance detecting unit includes a second output unit for outputting a second internal signal when the reference point detecting unit detects a rising edge of the reference clock signal in time before the transition point detecting unit detects transition of the data signal, and a phase advance signal output unit for outputting the phase advance signal when the second output unit outputs the second internal signal and the comparison period detecting unit detects transition of the data signal during the comparison period.

Also, preferably, the reference clock signal is a clock indicating a timing at which the data signal is latched. The phase relationship detecting unit includes a phase delay detecting unit and a phase advance detecting unit. The phase delay detecting unit outputs a phase delay signal when a rising edge of the reference clock signal occurs in time before transition of the data signal and the comparison period detecting unit detects transition of the data signal during the comparison period. The phase advance detecting unit outputs a phase advance signal when a rising edge of the reference clock signal occurs in time after transition of the data signal and the comparison period detecting unit detects transition of the data signal during comparison period.

In the phase comparator, a phase delay signal is output when the phase of a reference clock signal is advanced from the data signal, and a phase advance signal is output when the phase of a reference clock signal is delayed from a data signal. Thus, the phase delay signal and the phase advance signal are output as a result of detection of a phase relationship. By referencing the result of detection of a phase relationship, a rising edge of a reference clock signal can be provided at a position that is located a predetermined period away from a transition point of a data signal. In other words, a rising edge of a reference clock signal that is a latch clock can be provided in a middle portion between transition points of a data signal.

Preferably, the phase delay detecting unit includes a reference point detecting unit for detecting a rising edge of the reference clock signal, a first output unit for outputting a first internal signal, depending on a timing at which the reference point detecting unit detects a rising edge of the reference clock signal, and a phase delay signal output unit for outputting the phase delay signal when the first output unit outputs the first internal signal and the comparison period detecting unit detects transition of the data signal during comparison period. The phase advance detecting unit includes a transition point detecting unit for detecting transition of the data signal, a second output unit for outputting a second internal signal, depending on a timing at which the transition point detecting unit detects transition of the data signal, and a phase advance signal output unit for outputting the phase advance signal when the second output unit outputs the second internal signal and the comparison period detecting unit detects transition of the data signal during comparison period. The first output unit outputs the first internal signal when the transition point detecting unit detects transition of the data signal in time after the reference point detecting unit detects a rising edge of the reference clock signal. The second output unit outputs the second internal signal when the transition point detecting unit detects transition of the data signal in time before the reference point detecting unit detects a rising edge of the reference clock signal.

According to another aspect of the present invention, a phase comparison device performs phase comparison with respect to a data signal, using m first clock signals, m second clock signals corresponding to the m first clock signals, and m reference clock signals corresponding to the m first clock signals. Data has a one-bit length of T (T<0). The m first clock signals each have a period of nT (n is an integer, n≧2). A phase difference between adjacent signals of the m first clock signals is a multiple of 1 T. The m second clock signals have phases delayed by h (0<h≦1 T) from the corresponding first clock signals. The m reference clock signals have phases delayed by i (0<i<h) from the corresponding first clock signals. The phase comparison device includes m comparison period detecting units and m phase relationship detecting units. A p-th (p is an integer, 1≦p≦m) one of the m comparison period detecting units receives the data signal, a p-th one of the m first clock signals, and a p-th one of the m second clock signals, defines, as a p-th comparison period, a period between a rising edge of the p-th first clock signal and a rising edge of the p-th second clock signal, and detects the presence or absence of transition of the data signal during the p-th comparison period. A p-th one of the m phase relationship detecting units receives the data signal and a p-th one of the m reference clock signals, detecting a phase relationship between the data signal and the p-th reference clock signal, and outputs a result of detection of phase comparison as a p-th phase detection result when the p-th one of the m comparison period detecting units detects transition of the data signal during the p-th comparison period.

In the phase comparison device, the phase comparison process and the detection of the presence or absence of transition of a data signal during a comparison period are executed in parallel, and the result of detection of a phase relationship is output when transition of the data signal is detected. Here, the phase comparator does not need to include a delay element, so that a phase comparison process that is stable against the fluctuation of a power supply voltage and temperature can be achieved. Also, the number of clock signals required for the phase comparison process can be reduced as compared to an example of conventional four or more times oversampling. Moreover, the second clock signal supplied to the p-th (p is an integer, 1≦p≦n) phase comparator and the first clock signal supplied to the q-th (q is an integer, q=p+1 if 1≦p≦n−1 and q=1 if p=n) phase comparator can be caused to be the same, so that the number of required clock signals can be further reduced. Thus, a limited number of clock signals only need to be distributed, so that an increase in wiring area and an increase in power required for clock transmission can be suppressed, and a clock skew variation due to cross-coupling between wiring lines or the like, or a signal deterioration due to crosstalk, can be reduced.

According to another aspect of the present invention, a clock data recovery system includes a clock generating unit, a multi-phase clock selecting unit, a first phase comparing unit, and a phase control unit. The clock generating unit generates a plurality of main clocks having a period of nT (n is an integer, n≧2) and different phases with respect to a data signal of data having a one-bit length of T (0<T). The multi-phase clock selecting unit selects, from the plurality of main clocks generated by the clock generating unit, m (m is an integer, $2 \leq m \leq n$) first clock signals having a phase difference of a multiple of 1 T between adjacent signals, and m reference clock signals corresponding to the m first clock signals and having phases delayed by i ($0<i<h$, $0<h \leq 1$ T) from the corresponding first clock signals. The first phase comparing unit receives an externally input data signal, the m first clock signals and the m reference clock signals selected by the multi-phase clock selecting unit, and m second clock signals corresponding to the m first clock signals and having phases delayed by h from the corresponding first clock signals, and outputs m phase detection results. The phase control unit adjusts phases of clock signals selected by the multi-phase clock selecting unit, based on the m phase detection results from the phase comparing unit. The first phase comparing unit includes m comparison period detecting units and m phase relationship detecting units. A p-th one of the m comparison period detecting unit receives the data signal, a p-th one of the m first clock signals, and a p-th one of the m second clock signals, defines, as a p-th comparison period, a period between a rising edge of the p-th first clock signal and a rising edge of the p-th second clock signal, and detects the presence or absence of transition of the data signal during the p-th comparison period. A p-th one of the m phase relationship detecting units receives the data signal and a p-th one of the m reference clock signals, detects a phase relationship between the data signal and the reference clock signal, and outputs a result of detection of phase comparison as a p-th phase detection result when the p-th one of the m comparison period detecting units detects transition of the data signal during the p-th comparison period.

In the clock data recovery system, the phase comparison process and the detection of the presence or absence of transition of a data signal during a comparison period are executed in parallel, and the result of detection of a phase relationship is output when transition of the data signal is detected. Here, the phase comparator does not need to include a delay element, so that a phase comparison process that is stable against the fluctuation of a power supply voltage and temperature can be achieved. Also, the number of clock signals required for the phase comparison process can be reduced as compared to an example of conventional four or more times oversampling. Moreover, the second clock signal supplied to the p-th (p is an integer, $1 \leq p \leq n$) phase comparator and the first clock signal supplied to the q-th (q is an integer, $q=p+1$ if $1 \leq p \leq n-1$ and $q=1$ if $p=n$) phase comparator can be caused to be the same, so that the number of required clock signals can be further reduced. Thus, a limited number of clock signals only need to be distributed, so that an increase in wiring area and an increase in power required for clock transmission can be suppressed, and a clock skew variation due to cross-coupling between wiring lines or the like, or a signal deterioration due to crosstalk, can be reduced.

Preferably, the clock data recovery system further includes a second phase comparing unit. The second phase comparing unit includes k (k is an integer, $2 \leq k \leq m$) of the m comparison period detecting units and k of the m phase relationship detecting units corresponding to the k comparison period detecting units. The m comparison period detecting units and the m phase relationship detecting units included in the first phase comparing unit each operate in response to one of a rising edge and a falling edge of the data signal. The k comparison period detecting units and the k phase relationship detecting units included in the second phase comparing unit each operate in response to the other of the rising edge and the falling edge of the data signal. The phase control unit sets phases of clock signals selected by the multi-phase clock selecting unit, based on m phase detection results from the first phase comparing unit and k phase detection results from the second phase comparing unit.

In the clock data recovery system, not only a rising edge of received data, but also a falling edge of the received data are used in a phase comparison process, so that response characteristics of the clock data recovery system can be improved.

Effect of the Invention

As described above, a phase comparison process that is stable against the fluctuation of a power supply voltage and temperature can be achieved without the necessity of a high-precision delay means. Also, an increase in the number of clock signal phases required for a phase comparison process can be suppressed.

Figure 1:
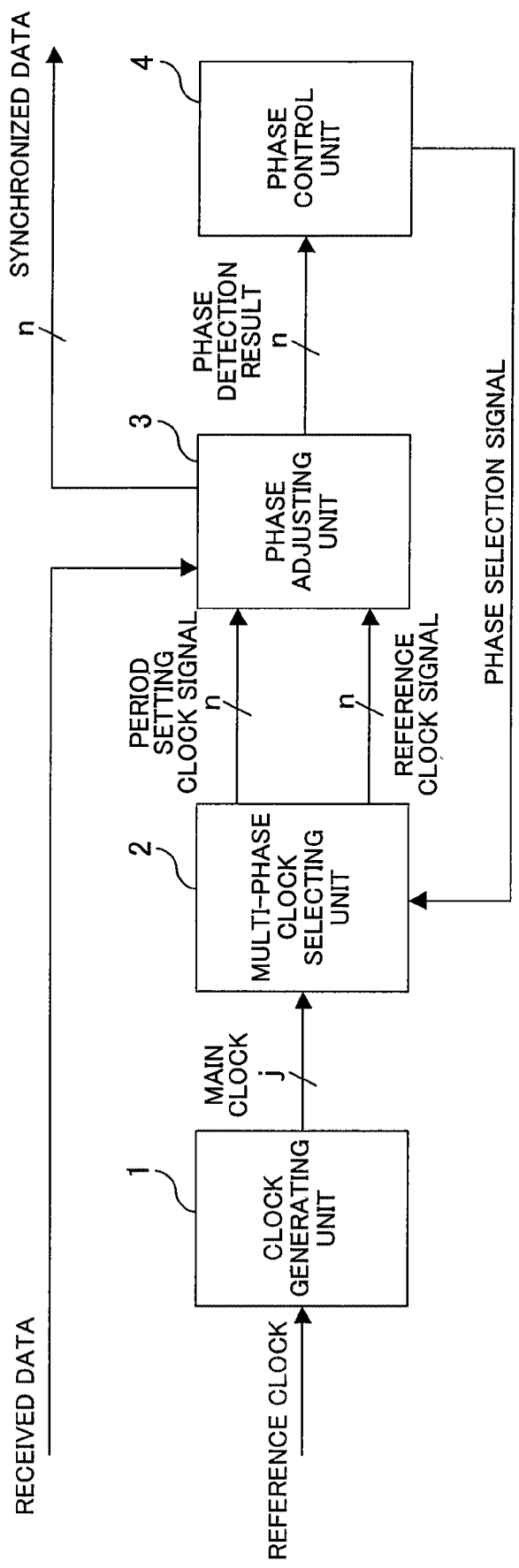
FIG. 1 is a block diagram showing a configuration of a clock data recovery system according to a first embodiment of the present invention.

DESCRIPTION OF THE REFERENCE CHARACTERS 1 clock generating unit
2 multi-phase clock selecting unit
3, 5 phase adjusting unit
4 phase control unit
10 phase comparator
11 comparison period detecting unit
12 phase relationship detecting unit
12a phase delay detecting unit
12b phase advance detecting unit
13a phase delay signal holding unit
13b phase advance signal holding unit
14 reception unit
101, 102, 105a, 105b flip-flop
103, 113, 106a, 106b logic circuit
EN10, 104 inverter
EN101, EN102, EN103, RE101 logic circuit
110 AND circuit
111, 112 flip-flop
114dd transition point detecting unit
114cc reference point detecting unit
115a, 115b, 212a, 213a, 212b, 213b, 312a, 313a, 312b, 313b NAND circuit
116a, 116b NOR circuit
211 delayed reference point detecting unit
301, 310 delay element
302 flip-flop
303 AND circuit
311 delayed transition point detecting unit
133 comparison signal holding unit
133a phase delay detection holding unit
133b phase advance detection holding unit

BEST MODE FOR CARRYING OUT THE INVENTION

Hereinafter, embodiments of the present invention will be described in detail with reference to the accompanying drawings. Note that the same or like parts are indicated by the same reference symbols and will not be repeatedly described.

First Embodiment

Configuration of Clock Data Recovery System

FIG. 1 shows a whole configuration of a clock data recovery system according to a first embodiment of the present invention. In this system, data communication is performed in which a data rate indicating the number of data bits per unit time is "1/T (0<T)". In the data communication, phase adjustment is executed using n clock signals that have a period of "nT (n is an integer, n≧2)" and a phase difference therebetween of "1 T" with respect to received data having a one-bit length of T.

The system includes a clock generating unit 1, a multi-phase clock selecting unit 2, a phase adjusting unit 3, and a phase control unit 4. In the phase adjusting unit 3, the period "nT" corresponding to n bits of received data is time-divided into periods "T" each corresponding to one bit and thereafter a phase comparison process is executed for each of the n periods "T" obtained by the devision. In other words, if the period "nT" corresponding to n bits of received data is assumed to be one cycle, the phase comparison process is executed n times in one cycle. Note that, here, for the sake of simplicity, the minimum phase change amount of the phase adjustment process is assumed to be "T/x (x is an integer of 1 or more)".

The clock generating unit 1, which is, for example, a general phase lock loop (PLL), generates j(j=n×x) main clocks based on reference clocks. Here, each of the j main clocks has a period of "nT", and a phase difference between adjacent phases is "T/x".

The multi-phase clock selecting unit 2, which is, for example, a selector circuit, selects n main clocks from the j main clocks, as "period setting clock signals", selects n main clocks from the j clock signals, as "reference clock signals", and outputs the selected n period setting clock signals and n reference clock signals, in accordance with a phase selection signal from the phase control unit 4.

Here, a phase difference between a p-th period setting clock signal (p is an integer, 1≦p≦n) and a q-th period setting clock signal (q is an integer, q=p+1 if 1≦p≦n−1, and q=1 if p=n) of the n period setting clock signals, is "1 T". Of the n reference clock signals, the phase of the p-th reference clock signal is delayed by "i (0≦i≦1 T)" from the p-th period setting clock signal. In other words, a rising edge of the p-th reference clock signal is located between a rising edge of the p-th period setting clock signal and a rising edge of the q-th period setting clock signal.

The phase adjusting unit 3 receives received data from the outside and the n period setting clock signals and the n reference clock signals output from the multi-phase clock selecting unit 2, detects a phase relationship between the received data and each of the n reference clock signals, and outputs n phase detection results. The phase adjusting unit 3 also latches received data in synchronization with clocks (latch clocks) indicating timings at which the received data is latched, and outputs n bits of synchronized data. Here, the latch clocks are n period setting clock signals whose phases are delayed by "1 T-i" from the respective n reference clock signals.

The phase control unit 4 changes the phase selection signal based on the phase detection result from the phase adjusting unit 3. The phase selection signal may be in any form. A simplest form is that which indicates which of the j main clocks the first period setting clock signal corresponds to. Specifically, the phase selection signal indicates the number of one of the j main clocks that is to be selected as the first period setting clock signal. For example, the phase control unit 4 decreases the number indicated by the phase selection signal when the phase detection result from the phase adjusting unit 3 indicates "phase delay", and increases the number when the phase detection result indicates "phase advance". Thereby, when the phase of the reference clock signal is delayed from received data, the phases of the period setting clock signal and the reference clock signal selected by the multi-phase clock selecting unit 2 are advanced, and when the phase of the reference clock signal is advanced from received data, the phases of the period setting clock signal and the reference clock signals are delayed. Thus, the phases of the period setting clock signal and the reference clock signal selected by the multi-phase clock selecting unit 2 are advanced or delayed, depending on the phase selection signal.

By repeatedly performing this operation, the phase of a clock is caused to follow the phase of received data.

It is here assumed that n=5, x=8 and i=T/2. In this case, the clock generating unit 1 generates main clocks having 40 phases (the first main clock to the fortieth main clock) each of which has a period of "5 T", where a phase difference between adjacent phases is "T/8". Here, the phase of the first main clock is most advanced, and the phase is more delayed as the number increases, and the phase of the fortieth main clock is most delayed. In this case, if the number indicated by the phase selection signal is assumed to be "3", the period setting clock signals and the reference clock signals are as follows.

[Period Setting Clock Signals]
first period setting clock signal=third main clock
second period setting clock signal=eleventh main clock
third period setting clock signal=nineteenth main clock
fourth period setting clock signal=twenty-seventh main clock
fifth period setting clock signal=thirty-fifth main clock
[Reference Clock Signals]
first reference clock signal=seventh main clock
second reference clock signal=fifteenth main clock
third reference clock signal=twenty-third main clock
fourth reference clock signal=thirty-first main clock
fifth reference clock signal=thirty-ninth main clock Firstly, selection of a period setting clock signal will be described. The "third main clock" is initially selected as the first period setting clock signal from the forty main clocks. Since it is here assumed that "x=8", the eleventh main clock that is delayed by eight phases from the third main clock is selected as the second period setting clock signal, and the nineteenth main clock that is delayed by eight phases from the eleventh main clock is selected as the third period setting clock signal. Similarly, the twenty-seventh main clock and the thirty-fifth main clock are selected as the fourth and fifth period setting clock signals, respectively. Thus, a phase difference between each of the first to fifth period setting clock signals is "8×(T/8)=1 T".

Next, selection of a reference clock signal will be described. Here, since "i=T/2", the seventh main clock that is delayed by four phases from the third main clock is selected as the first reference clock signal. Similarly, main clocks that are delayed by four phases from the second to fifth period setting clock signals are selected as the second to fifth reference clock signals, respectively. Thus, the phases of the first to fifth reference clock signals are delayed by "T/2" from the phases of the corresponding period setting clock signals.

<Configuration of Phase Adjusting Unit>

Figure 2:
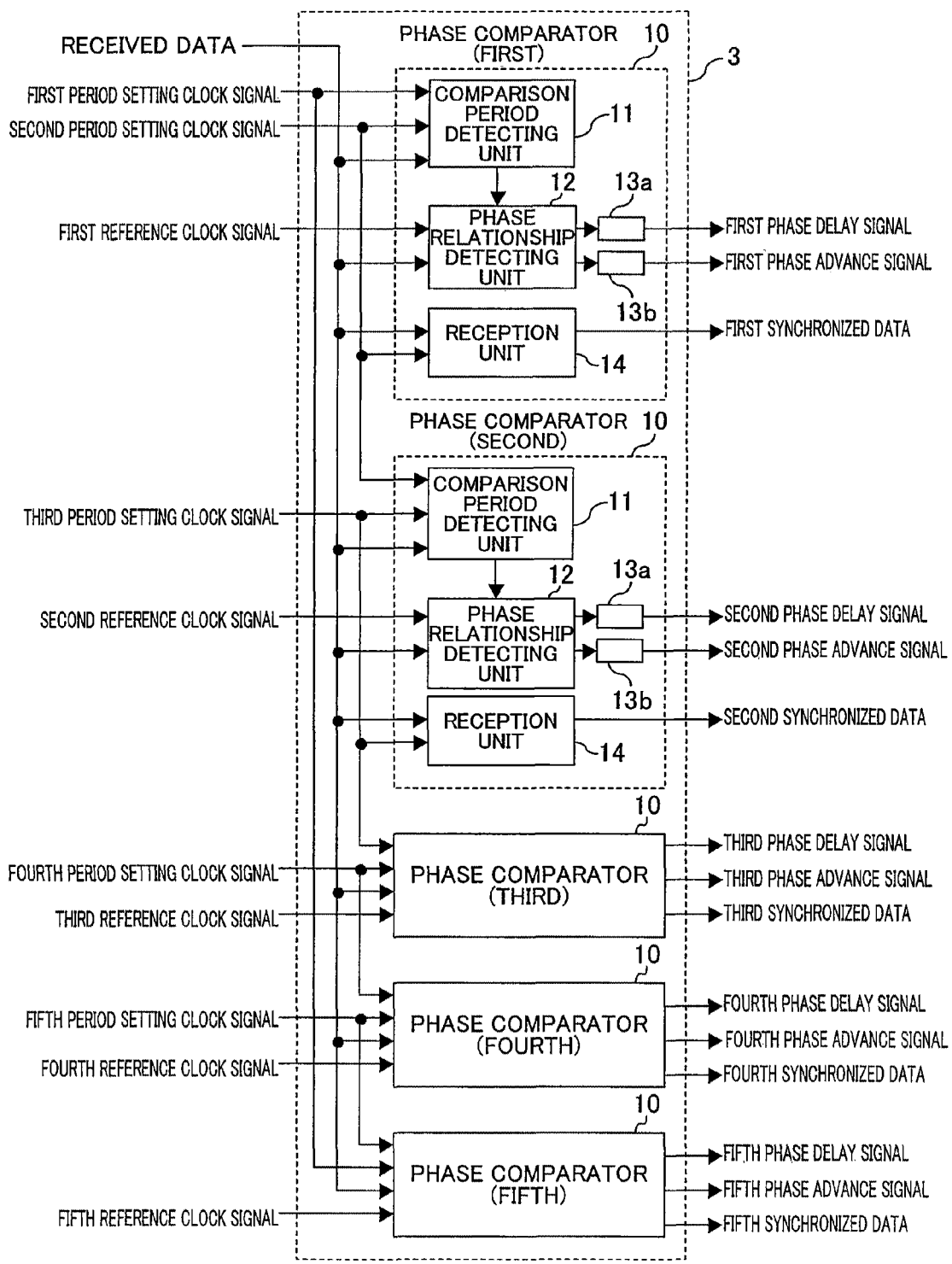
FIG. 2 is a block diagram showing an internal configuration of a phase adjusting unit of FIG. 1.

FIG. 2 shows a configuration of the phase adjusting unit 3 of FIG. 1. The phase adjusting unit 3 includes n (n=5 in FIG. 2) phase comparators 10. A p-th phase comparator 10 receives a p-th one of the n period setting clock signals as the first clock signal, and a second clock signal (here, a q-th period setting clock signal) whose phase is delayed by 1 T from the first clock signal. The p-th phase comparator 10 also receives a p-th one of the n reference clock signals. Note that, in FIG. 2, the second clock signal received by the p-th phase comparator 10 and the first clock signal received by the q-th phase comparator 10 are the same. For example, the first phase comparator 10 receives the second period setting clock signal as the second clock signal, and the second phase comparator 10 receives the second period setting clock signal as the first clock signal.

The five phase comparators 10 each define a period between a rising edge of the first clock signal and a rising edge of the second clock signal as a comparison period, and during this comparison period, detect a phase relationship between a reference clock signal and received data. Thus, two period setting clock signals having a phase difference of "1 T" are input to each of the five phase comparators, so that the phase adjusting unit 3 is configured to time-divide a period (i.e., 5 T) corresponding to five bits of received data into "1 T"s and perform a phase comparison process.

The five phase comparators 10 each include a comparison period detecting unit 11, a phase relationship detecting unit 12, a phase delay signal holding unit 13a, a phase advance signal holding unit 13b, and a reception unit 14.

The comparison period detecting unit 11 receives two period setting clock signals and received data, defines a period between edges of the two period setting clock signals as a comparison period, and detects the presence or absence of transition of the received data during the comparison period.

The phase relationship detecting unit 12 detects a phase relationship between a reference clock signal and received data, and when the comparison period detecting unit 11 detects transition of received data during the comparison period, outputs the result of detection of a phase relationship (a phase delay signal and a phase advance signal).

The phase delay signal holding unit 13a holds and outputs the phase delay signal from the phase relationship detecting unit 12. The phase advance signal holding unit 13b holds and outputs the phase advance signal from the phase relationship detecting unit 12.

The reception unit 14 holds received data in synchronization with a latch clock (here, one of the two period setting clock signals that has a delayed phase), and outputs the held received data as synchronized data.

<Configuration of Phase Comparator>

Figure 3:
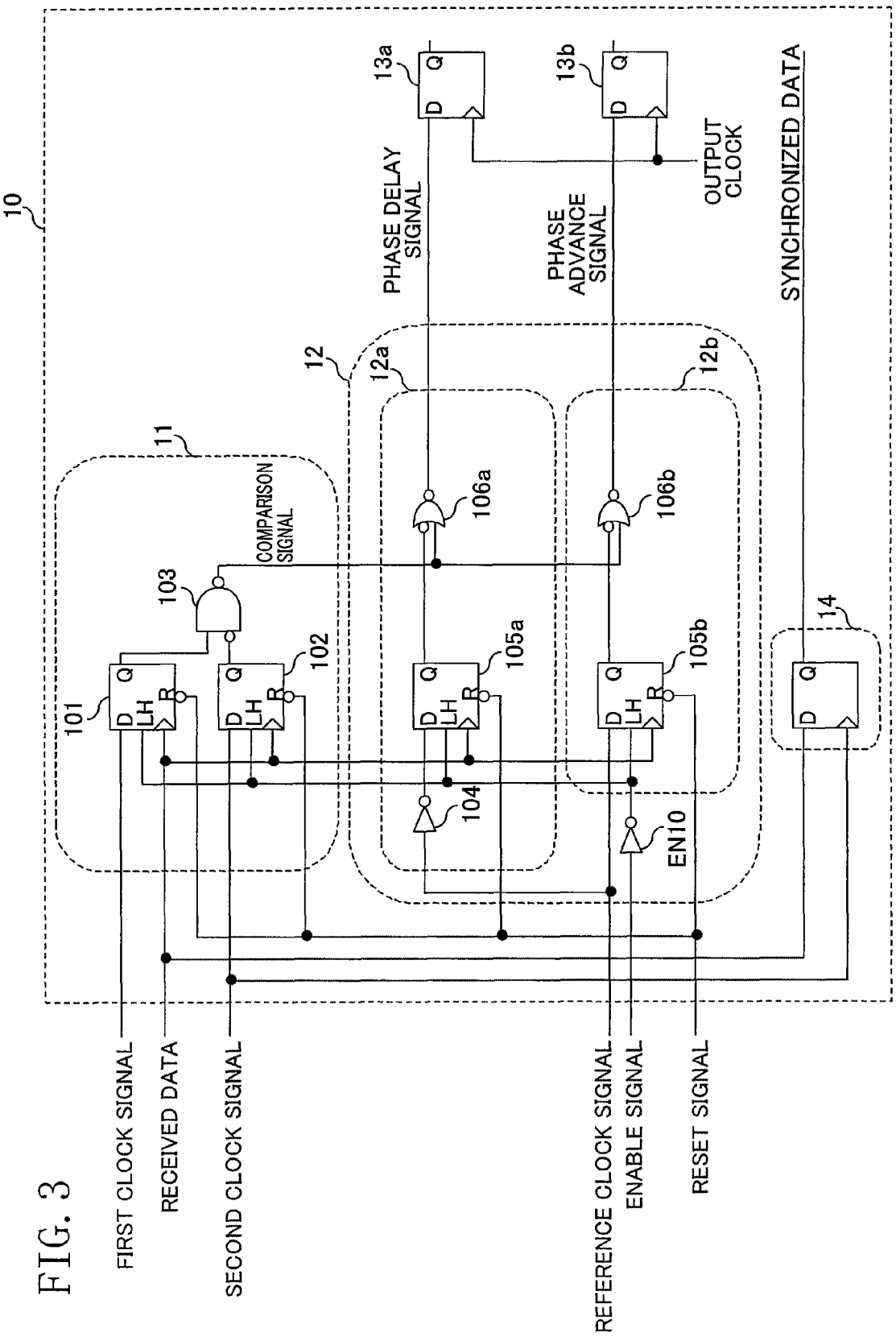
FIG. 3 is a circuit diagram showing a configuration of a phase comparator of FIG. 2.

FIG. 3 shows a detailed configuration of the phase comparator 10 of FIG. 2. Note that the first phase comparators 10 will be described as an example. Specifically, the first clock signal is the "first period setting clock signal". The second clock signal is a clock signal (second period setting clock signal) whose phase is delayed by "1 T" from the first clock signal. The reference clock signal is a clock signal (first reference clock signal) whose phase is delayed by "i" from the first clock signal.

The comparison period detecting unit 11 includes flip-flops 101 and 102 and a logic circuit 103. The flip-flop 101 holds the first clock signal in synchronization with a rising edge of received data. The flip-flop 102 holds the second clock signal in synchronization with a rising edge of received data. The logic circuit 103, when the output of the flip-flop 101 is at the "H level" and the output of the flip-flop 102 is at the "L level", causes its output to go to the "L" level (i.e., outputs a comparison signal), and when otherwise, causes its output to go to the "H level" (i.e., stops outputting a comparison signal).

The phase relationship detecting unit 12 includes a phase delay detecting unit 12a and a phase advance detecting unit 12b.

The phase delay detecting unit 12a determines that there is a "phase delay" when a rising edge of a reference clock signal occurs in time after a rising edge of received data, and outputs a phase delay signal if a comparison signal is output from the comparison period detecting unit 11, and does not output a phase delay signal if a comparison signal is not output. Specifically, the phase delay detecting unit 12a includes an inverter 104, a flip-flop 105a, and a logic circuit 106a. The inverter 104 inverts a reference clock signal. The flip-flop 105a holds the output (i.e., the inverted signal of the reference clock signal) of the inverter 104 in synchronization with a rising edge of received data. The logic circuit 106a, when the output of the flip-flop 105a is at the "H level" and the comparison signal from the comparison period detecting unit 11 is at the "L level", causes its output to go to the "H level" (i.e., outputs a phase delay signal), and when otherwise, causes its output to go to the "L level" (i.e., does not output a phase delay signal).

The phase advance detecting unit 12b determines that there is a "phase advance" when a rising edge of a reference clock signal occurs in time before a rising edge of received data, and outputs a phase advance signal if a comparison signal is output from the comparison period detecting unit 11, and does not output a phase advance signal if a comparison signal is not output. Specifically, the phase advance detecting unit 12b includes a flip-flop 105b and a logic circuit 106b. The flip-flop 105b holds a reference clock signal in synchronization with a rising edge of received data. The logic circuit 106b, when the output of the flip-flop 105b is at the "H level" and the comparison signal from the comparison period detecting unit 11 is at the "L level", causes its output to go to the "H level" (i.e., outputs a phase advance signal), and when otherwise, causes its output to go to "L level" (i.e., does not output a phase advance signal).

The phase delay signal holding unit 13a, which is, for example, a flip-flop, holds a phase delay signal in synchronization with an output clock, and outputs the held phase delay signal. The phase advance signal holding unit 13b, which is, for example, a flip-flop, holds a phase advance signal in synchronization with an output clock, and outputs the held phase advance signal. Note that, in order to reliably hold a phase delay signal and a phase advance signal even when a rising edge of received data occurs immediately before an end point of a comparison period (i.e., immediately before a rising edge of the second clock signal), the phase of the output clock is preferably delayed from the second clock signal. Here, as the output clock, the "fourth period setting clock signal" whose phase is delayed by "3 T" from the first clock signal is used.

The reception unit 14, which is, for example, a flip-flop, holds received data in synchronization with a latch clock (here, the second clock signal). The held received data is output as synchronized data.

<<Enable Signal>>

Also, the flip-flops 101, 102, 105a and 105b, each of which is a flip-flop with a load/hold mode switching function, receives an enable signal inverted by an inverter EN10, operates in synchronization with a rising edge of received data only during a period when an output signal of the inverter EN10 is at the "L level" (i.e., the enable signal is at the "H level"), and continues to hold a value without being synchronous with a rising edge of received data during a period when the output signal of the inverter EN10 is at the "H level" (i.e., the enable signal is at the "L level"). In other words, the enable signal is a signal for limiting operation periods of the comparison period detecting unit 11, the phase delay detecting unit 12a and the phase advance detecting unit 12b.

The comparison period detecting unit 11, the phase delay detecting unit 12a, and the phase advance detecting unit 12b may be caused to operate during a comparison period, and therefore, the enable signal may be ideally at the "H level" only during a period corresponding to a comparison period. If such an enable signal can be generated, a configuration for generating a comparison signal (the comparison period detecting unit 11) would not be required in the phase comparator 10 of FIG. 3. Actually, if a data rate is increased, the H-level period of the enable signal is considerably decreased, so that influences of a load capacitance and a gate delay due to the load capacitance tend to become significant. In this case, it is difficult to correctly reproduce a comparison period using only the enable signal. Moreover, constraints on setting up and holding of an LH input for switching the load mode and the hold mode of a flip-flop needs to be considered, for example, leading to a problem with implementation. Therefore, the enable signal preferably has as long a pulse width as possible and is preferably synchronous with a clock signal, so as to avoid an influence of process variations, and an influence of fluctuation of a power supply voltage or temperature.

Figure 4:
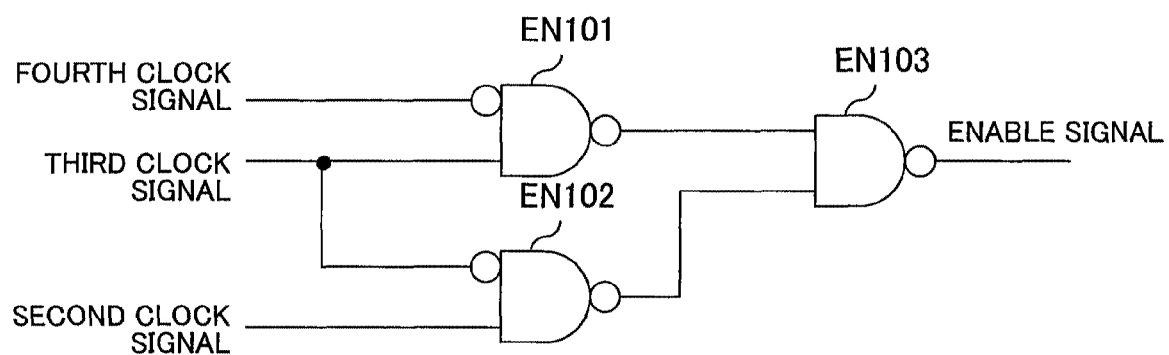
FIG. 4 is a circuit diagram showing an exemplary configuration for generating an enable signal.

FIG. 4 shows an exemplary configuration for generating the enable signal. An enable signal generating unit includes three logic circuits EN101, EN102 and EN103, for example. Here, the third clock signal is a clock signal (here, the third period setting clock signal) whose phase is delayed by "2 T" from the first clock signal, and the fourth clock signal is a clock signal (here, the fourth period setting clock signal) whose phase is delayed by "3 T" from the first clock signal. The enable signal generated by this configuration is synchronous with any of the period setting clock signals, with the H-level period being "3 T" and the L-level period being "2 T".

<<Reset Signal>>

Further, the flip-flops 101, 102, 105a and 105b each receive a reset signal, and operates, depending on received data and an enable signal, during a period when the reset signal is at the "H level", and causes a value held therein to go to the "L" (clears the held content) during a period when the reset signal is at the "L level". Here, the phase detection result obtained before a comparison period may be cleared by the time when the comparison period is started. Therefore, the reset signal may go to the "L level" during a period from when the phase delay signal holding unit 13a and the phase advance signal holding unit 13b complete holding of a phase delay signal and a phase advance signal to when the next comparison period is started (i.e., from a rising edge of the output clock to a rising edge of the first clock signal defining the start point of the next comparison period).

Figure 5:
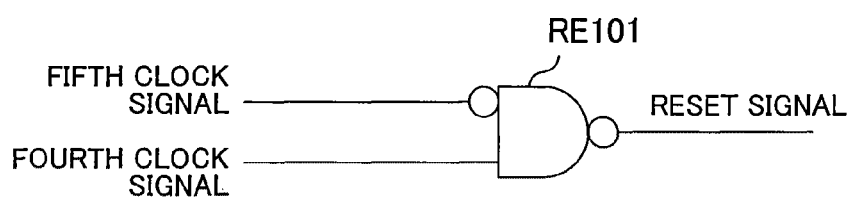
FIG. 5 is a circuit diagram showing an exemplary configuration for generating a reset signal.

FIG. 5 shows an exemplary configuration for generating the reset signal. Here, the fifth clock signal is a clock signal (here, the fifth period setting clock signal) whose phase is delayed by "4 T" from the first clock signal. The reset signal generated by this configuration is at the "L level" during a period from a rising edge of the fourth clock signal to a rising edge of the fifth clock signal. In other words, the reset signal is at the "L level" during any period between a rising edge of the output clock and a rising edge of the first clock signal.

<Operation of Phase Comparator>

An operation of the phase comparator 10 of FIG. 3 will be described with reference to FIG. 6. Note that it is here assumed that the phase of a reference clock signal is delayed by "T/2" from the first clock signal.

Initially, a rising edge C11 of the first clock signal occurs, and a rising edge E1 of received data occurs during a period when the first clock signal is at the "H level" and the second clock signal is at the "L level". A comparison signal goes to the "L level" in synchronization with the rising edge E1. On the other hand, a rising edge C01 of the reference clock signal occurs in time after the rising edge E1, so that the phase delay signal goes to the "H level".

Next, when a rising edge C21 of the second clock signal occurs and the second clock signal goes to the "H level", an enable signal goes to the "L level" in synchronization with the rising edge C21. Therefore, even if data edges E2 and E3 are rising edges of received data, the comparison signal, the phase delay signal, and the phase advance signal hold the immediately previous states without changing.

Next, a rising edge C31 of the third clock signal occurs and the third clock signal goes to the "H level", and thereafter, a rising edge C41 of the fourth clock signal occurs. The phase delay signal holding unit 13a and the phase advance signal holding unit 13b hold a phase delay signal and a phase advance signal in synchronization with the rising edge C41 of the fourth clock signal. The phase delay signal and the phase advance signal continue to be held by the time when the next rising edge of the fourth clock signal occurs.

Also, when the rising edge C41 of the fourth clock signal occurs and the fourth clock signal goes to the "L level", the reset signal goes to the "L level" in synchronization with the rising edge C41. Thereby, the comparison signal, the phase delay signal, and the phase advance signal are reset to initial values. On the other hand, the enable signal goes to the "H level" in synchronization with the rising edge C41 of the fourth clock signal. Although the enable signal is at the "H level", the reset signal is at the "L level". Therefore, even if a data edge E4 is a rising edge of received data, none of the comparison period detecting unit 11, the phase delay detecting unit 12a, and the phase advance detecting units 12b operates, so that the comparison signal, the phase delay signal and the phase advance signal remain at their initial values without changing.

Next, when a rising edge C51 of the fifth clock signal occurs and the fifth clock signal goes to the "H level", the reset signal goes to the "H level" in synchronization with the rising edge C51. If it is here assumed that a data edge E5 is a rising edge of received data, the enable signal is at the "H level", the flip-flop 105a of the phase delay detecting unit 12a holds the inverted signal of the reference clock signal in synchronization with the data edge E5, and the output of the flip-flop 105a goes to the "H level". However, since both the first and second clock signals are at the "L level", the comparison signal from the comparison period detecting unit 11 is at the "H level", so that the phase delay signal remains at the "L level".

Thus, when transition of received data occurs during a comparison period defined by rising edges of the first and second clock signals, the result of detection of a phase relationship between a reference clock signal and the received data is output.

On the other hand, when the rising edge C01 of the reference clock signal occurs in time before the rising edge E1 of the received data during the comparison period, the phase delay signal remains at the "L level" and the phase advance signal goes to the "H level". The subsequent process is similar to that which has been described above. Finally, the output of the phase advance signal holding unit 13b goes to the "H level".

Also, when the rising edge C01 of the reference clock signal and the rising edge E1 of the received data simultaneously occur, the output of the inverter 104 is at the "H level" due to a delay of the inverter 104, so that both the output of the flip-flop 105a of the phase delay detecting unit 12a and the output of the flip-flop 105b of the phase advance detecting unit 12b are at the "H level". In this case, since it can be determined that the phase of a reference clock signal and the phase of received data have an ideal relationship, the phase delay signal and the phase advance signal are canceled with each other in the phase control unit 4.

Thus, a phase relationship between received data and a reference clock signal is detected. In the clock data recovery system, the phase control unit 4 performs phase adjustment based on the phase detection result, thereby making it possible to cause a rising edge of the reference clock signal to be close to a rising edge of the received data. Thereby, a rising edge of the second clock signal can be provided at a middle portion between each rising edge of the received data (a portion having a well open data eye), so that synchronized data can be correctly obtained.

<Effect>

Thus, the detection of the presence or absence of transition of a data signal during a comparison period is executed in parallel with a phase comparison process, and when the transition of the data signal is detected, the result of detection of a phase relationship is output. Thereby, a delay element may not be used, so that a phase comparison process that is stable against the fluctuation of a power supply voltage or temperature can be achieved.

Also, in this embodiment, three clock signals (the first clock signal, the second clock signal, and the reference clock signal) may be supplied to one phase comparator, so that the total number of clock signals supplied to n phase comparators may be "3n". Moreover, the second clock signal supplied to a p-th (p is an integer, $1 \leq p \leq n$) phase comparator and the first clock signal supplied to a q-th (q is an integer, $q=p+1$ if $1 \leq p \leq n-1$, and $q=1$ if $p=n$) phase comparator can be caused to be the same, so that the number of required clock signals can be further reduced (in this case, the total number of clocks is "2n"). In an example of conventional oversampling, the number of clock signals required for a phase comparison process is "α×n" (α: the number of times of oversampling, n: the number of bits process per cycle), and therefore, the number of clock signals required for a phase comparison process can be reduced. Thus, a limited number of clock signals only need to be distributed, so that an increase in wiring area and an increase in power required for clock transmission can be suppressed, and a clock skew variation due to cross-coupling between wiring lines or the like, or a signal deterioration due to crosstalk, can be reduced.

(Variation of Phase Comparator of First Embodiment)

Figure 6:
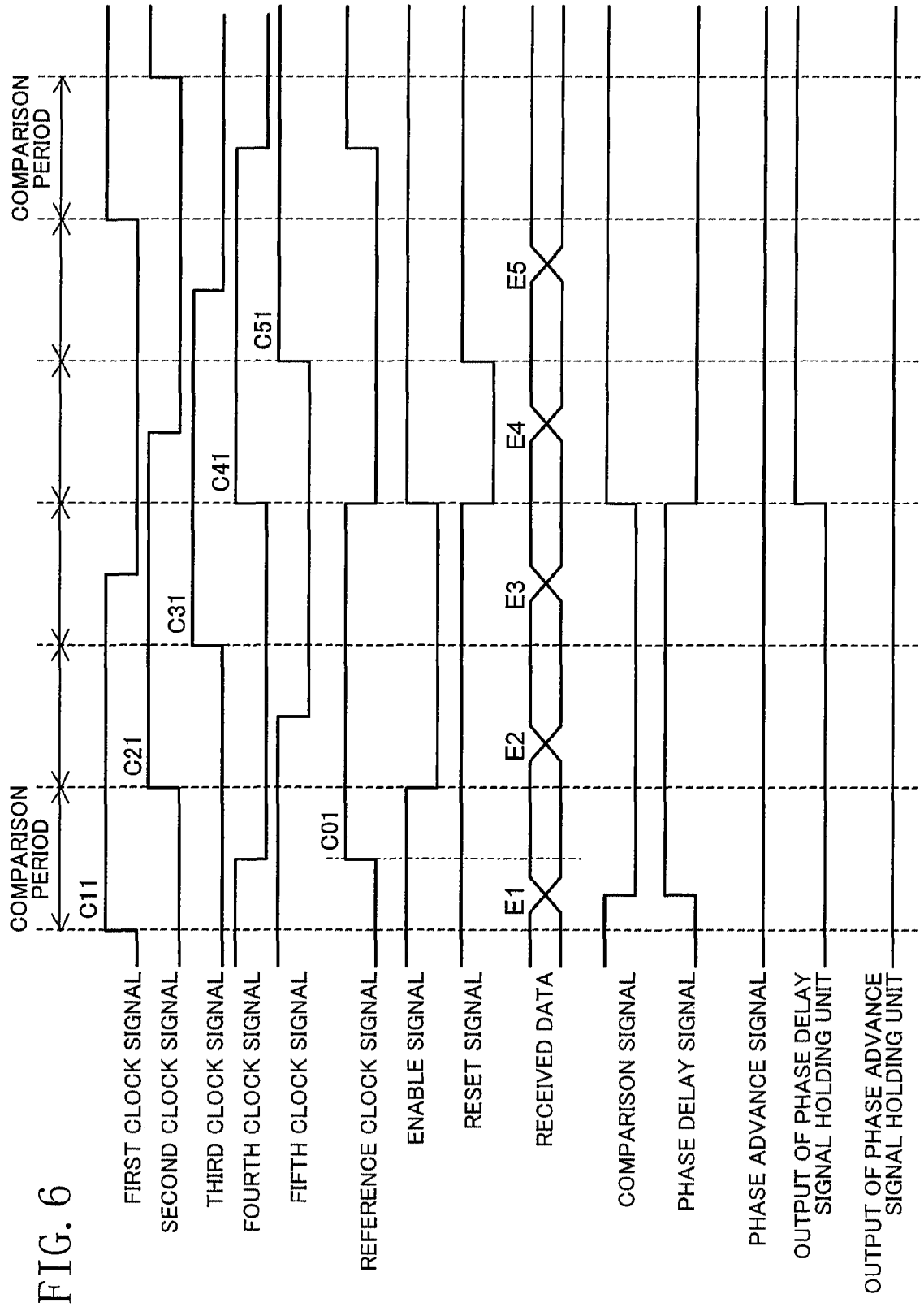
FIG. 6 is a diagram for describing an operation of a phase comparator of FIG. 3.

Note that, as shown in FIG. 6, when the enable signal goes to the "H level" before the start point of a comparison period, the flip-flops 111, 112, 105a and 105b may be replaced with general delay flip-flops, and a mask data signal that is the logical AND of received data and the enable signal is input as a clock signal to each delay flip-flop. In this case, a similar operation can be achieved.

<Configuration>

Figure 7:
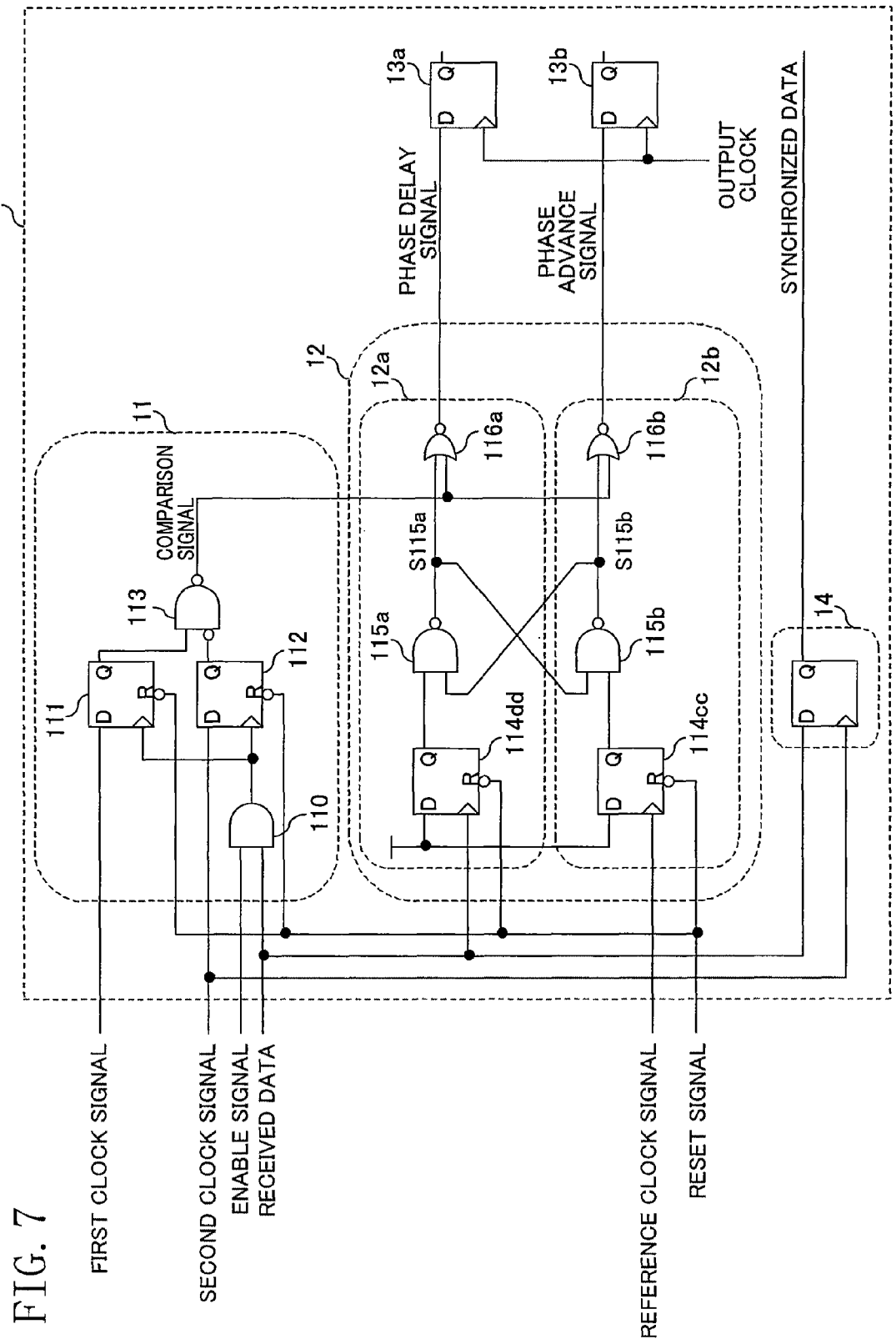
FIG. 7 is a circuit diagram showing a variation of the phase comparator of FIG. 3.

FIG. 7 shows a variation of the phase comparator of FIG. 3. Here, a delay flip-flop is used in each of the comparison period detecting unit 11, the phase delay detecting unit 12a, and the phase advance detecting unit 12b.

The comparison period detecting unit 11 includes an AND circuit 110, flip-flops 111 and 112, and a logic circuit 113. The AND circuit 110 receives an enable signal and received data, and outputs a mask data signal that is the logical AND of the enable signal and the received data. The flip-flop 111 holds the first clock signal in synchronization with a rising edge of the mask data signal from the AND circuit 110. The flip-flop 112 holds the second clock signal in synchronization with a rising edge of the mask data signal. The logic circuit 113, when the output of the flip-flop 111 is at the "H level" and the output of the flip-flop 112 is at the "L level", outputs a comparison signal (causes the comparison signal to go to the "L level").

The phase delay detecting unit 12a includes a flip-flop (transition point detecting unit) 114dd, a NAND circuit 115a, and a NOR circuit 116a. The phase advance detecting unit 12b includes a flip-flop (reference point detecting unit) 114cc, a NAND circuit 115b, and a NOR circuit 116b. The transition point detecting unit 114dd receives a power supply voltage and received data, and holds the "H level" in synchronization with a rising edge of received data. The reference point detecting unit 114cc receives a power supply voltage and a reference clock signal, and holds the "H level" in synchronization with a rising edge of the reference clock signal. The NAND circuits 115a and 115b, which constitute an RS latch, causes one of the output of the transition point detecting unit 114dd and the output of the reference point detecting unit 114cc that goes to the "H level" earlier than the other to be effective, and does not output the other by masking it. In an initial state, since both the outputs of the transition point detecting unit 114dd and the reference point detecting unit 114cc are at the "L level", both the two outputs (a first internal signal S115a and a second internal signal S115b) of the RS latch are at the "H level". Here, when the output of the transition point detecting unit 114dd goes to the "H level" earlier, the first internal signal S115a goes from the "H level" to the "L level" and the second internal signal S115b remains at and is fixed to the "H level". On the other hand, when the output of the reference point detecting unit 114cc goes to the "H level" earlier, the second internal signal S115b goes to the "L level" and the first internal signal remains at and is fixed to the "H level".

The NOR circuit 116a, when both the first internal signal S115a from the RS latch and the comparison signal from the comparison period detecting unit 11 are at the "L level", causes its output to go to the "H level" (i.e., a phase delay signal is output), and when otherwise, causes its output to the "L level" (i.e., a phase delay signal is not output). The NOR circuit 116b, when both the second internal signal S115b from the RS latch and the comparison signal from the comparison period detecting unit 11 are at the "L level", causes its output to go to the "H level" (i.e., a phase advance signal is output), and when otherwise, causes its output to go to the "L level" (i.e., a phase advance signal is not output).

<Operation>

As shown in FIG. 6, when a rising edge of the reference clock signal occurs in time after the rising edge E1 of the received data, the output of the transition point detecting unit 114dd goes to the "H level" earlier than the output of the reference point detecting unit 114cc in the phase relationship detecting unit 12, so that a phase delay signal is output. On the other hand, when a rising edge of the reference clock signal occurs before the rising edge E1 of the received data, the output of the reference point detecting unit 114cc goes to the "H level" earlier than the output of the transition point detecting unit 114dd in the phase relationship detecting unit 12, so that a phase advance signal is output.

The outputs of the comparison period detecting unit 11, the phase delay detecting unit 12a, and the phase advance detecting unit 12b are each held until a reset signal goes to the "L level", and when the reset signal goes to the "L level", are cleared (go to the "L level").

<Effect>

With this configuration, the D inputs of the delay flip-flops of the transition point detecting unit 114dd and the reference point detecting unit 114cc are pulled up to a power supply, so that rising timings of received data and a reference clock signal can be evaluated without considering a setup constraint.

Second Embodiment

<Configuration of Clock Data Recovery System>

The configurations of a clock data recovery system and a phase adjusting unit according to a second embodiment of the present invention are similar to those of FIGS. 1 and 2, except for the configuration of the phase comparator 10. Each phase comparator 10 receives a reference clock signal and a delayed reference clock signal corresponding to the reference clock signal, and compares phases of received data and the reference clock signal to detect the presence or absence of a "phase delay", and compares phases of received data and the delayed reference clock signal to detect the presence or absence of a "phase advance". For example, the first phase comparator receives a first delayed reference clock signal corresponding to a first reference clock signal. A delayed reference clock signal, which is a signal whose phase is delayed from a reference clock signal, may be generated by delaying the reference clock signal using a delay element, or may be achieved by selecting a main clocks that is delayed by a predetermined number of phases from the reference clock signal in the multi-phase clock selecting unit 2.

<Configuration of Phase Comparator>

Figure 8:
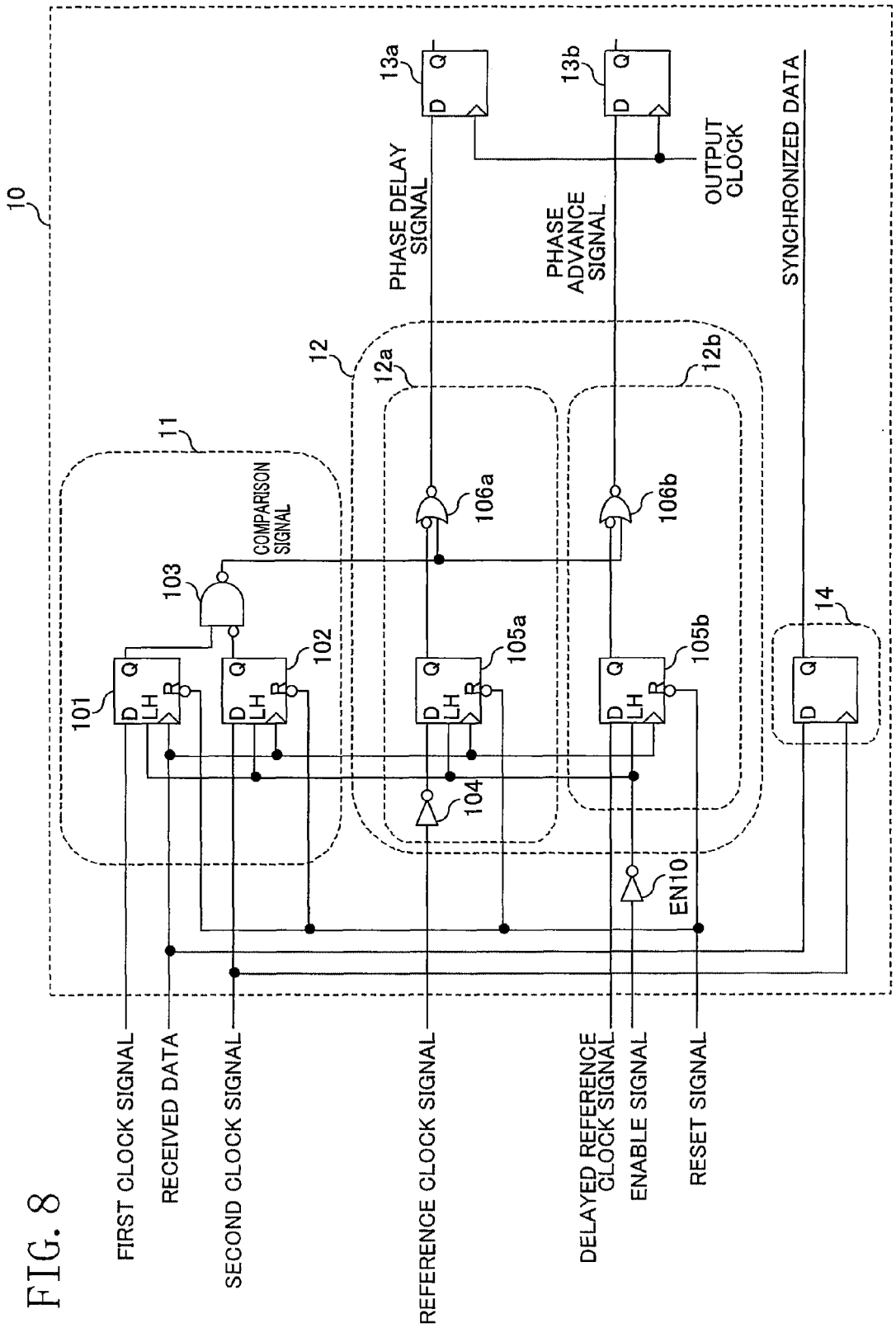
FIG. 8 is a circuit diagram showing a configuration of a phase comparator according to a second embodiment of the present invention.

FIG. 8 shows a configuration of the phase comparator of the second embodiment of the present invention. In this phase comparator 10, a phase advance detecting unit 12b receives a delayed reference clock signal instead of a reference clock signal. The other configuration is similar to that of FIG. 3. Note that a delay amount of the delayed reference clock signal from the reference clock signal is "D (0<D<T-i)".

<Operation of Phase Comparator>

Figure 9:
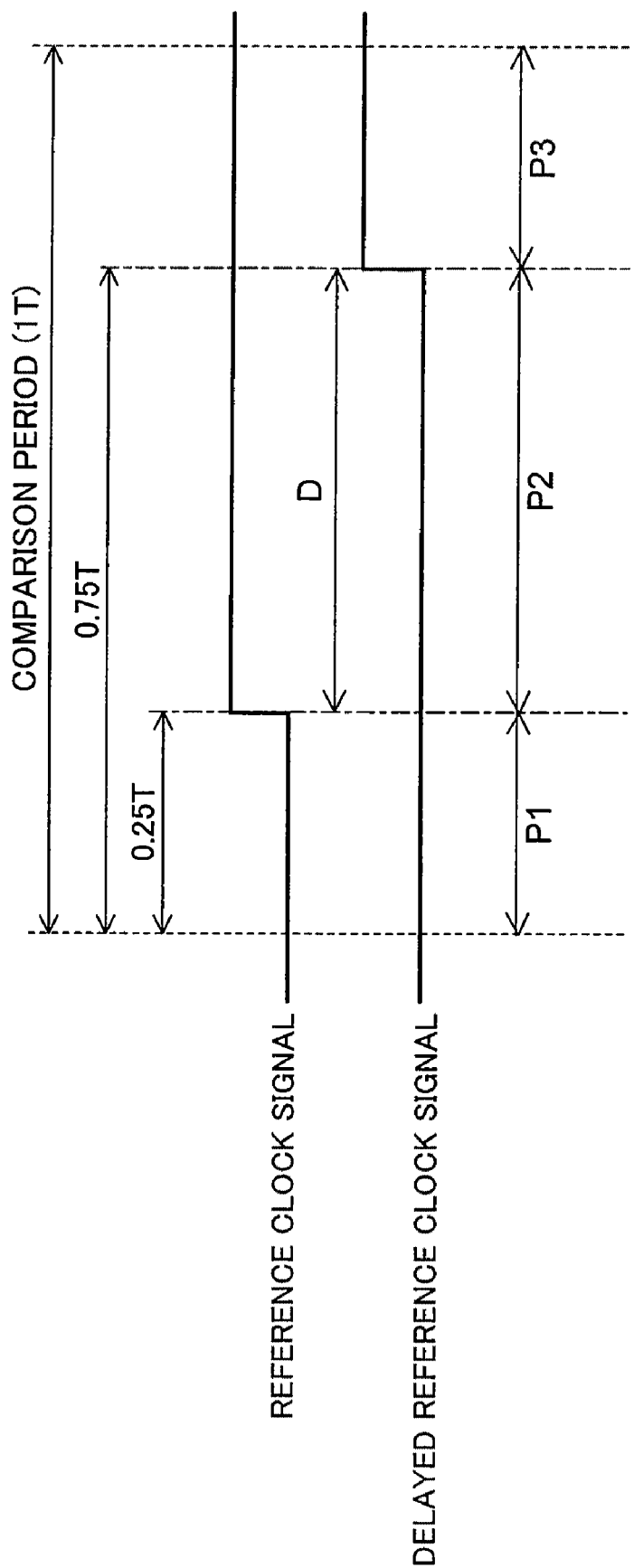
FIG. 9 is a diagram for describing an operation of the phase comparator of FIG. 8.

An operation of the phase comparator of FIG. 8 will be described with reference to FIG. 9. In FIG. 9, attention is paid to a comparison period defined by rising edges of the first and second clock signals.

When a rising edge of received data occurs during a period P1 from a rising edge of the first clock signal to a rising edge of the reference clock signal, the phase delay detecting unit 12a holds an inverted signal of the reference clock signal, and therefore, the output of the phase delay detecting unit 12a goes to the "H level" (i.e., a phase delay signal is output).

When a rising edge of received data occurs during a period P2 from a rising edge of the reference clock signal to a rising edge of the delayed reference clock signal, the flip-flop 105a of the phase delay detecting unit 12a holds the "L level" since the inverted signal of the reference clock signal is at the "L level". On the other hand, the flip-flop 105b of the phase advance detecting unit 12b holds the "L level" since the delayed reference clock signal is at the "L level". As a result, neither a phase delay signal nor a phase advance signal is output. In other words, the period P2 of the comparison period is a "dead zone" in which even when a rising edge of received data occurs, the result of detection of a phase relationship is not output.

When a rising edge of received data occurs during a period P3 from a rising edge of the delayed reference clock signal to a rising edge of the second clock signal, the phase advance detecting unit 12b holds the delayed reference clock signal, so that the output of the phase advance detecting unit 12b goes to the "H level" (i.e., a phase advance signal is output).

<Phase of Delayed Reference Clock Signal>

As can be seen from FIG. 9, a rising edge of the delayed reference clock signal needs to occur within a corresponding comparison period. Moreover, in order to achieve the symmetry of the phase detection result, the period P1 and the period P3 preferably have the same length. Here, it is optimal when the phase of the delayed reference clock signal is delayed by "0.5 T" from the reference clock signal (e.g., the phase of the reference clock signal is delayed by "0.25 T" from the first clock signal, and the phase of the delayed reference clock signal is delayed by "0.75 T" from the first clock signal).

<Effect>

As described above, by forming a dead zone using a reference clock signal and a delayed reference clock signal, endurance against jitter is improved. Moreover, in the case of a configuration in which the delayed reference clock signal is supplied from the multi-phase clock selecting unit, a delay element is not required, so that an influence of fluctuation of a power supply voltage or temperature can be reduced.

(Variation of Phase Comparator of Second Embodiment)

Note that, in the case of a configuration in which the enable signal goes to the "H level" before the start point of a comparison period, the flip-flop with a load/hold mode switching function can be replaced with a general delay flip-flop as in the first embodiment.

<Configuration>

Figure 10:
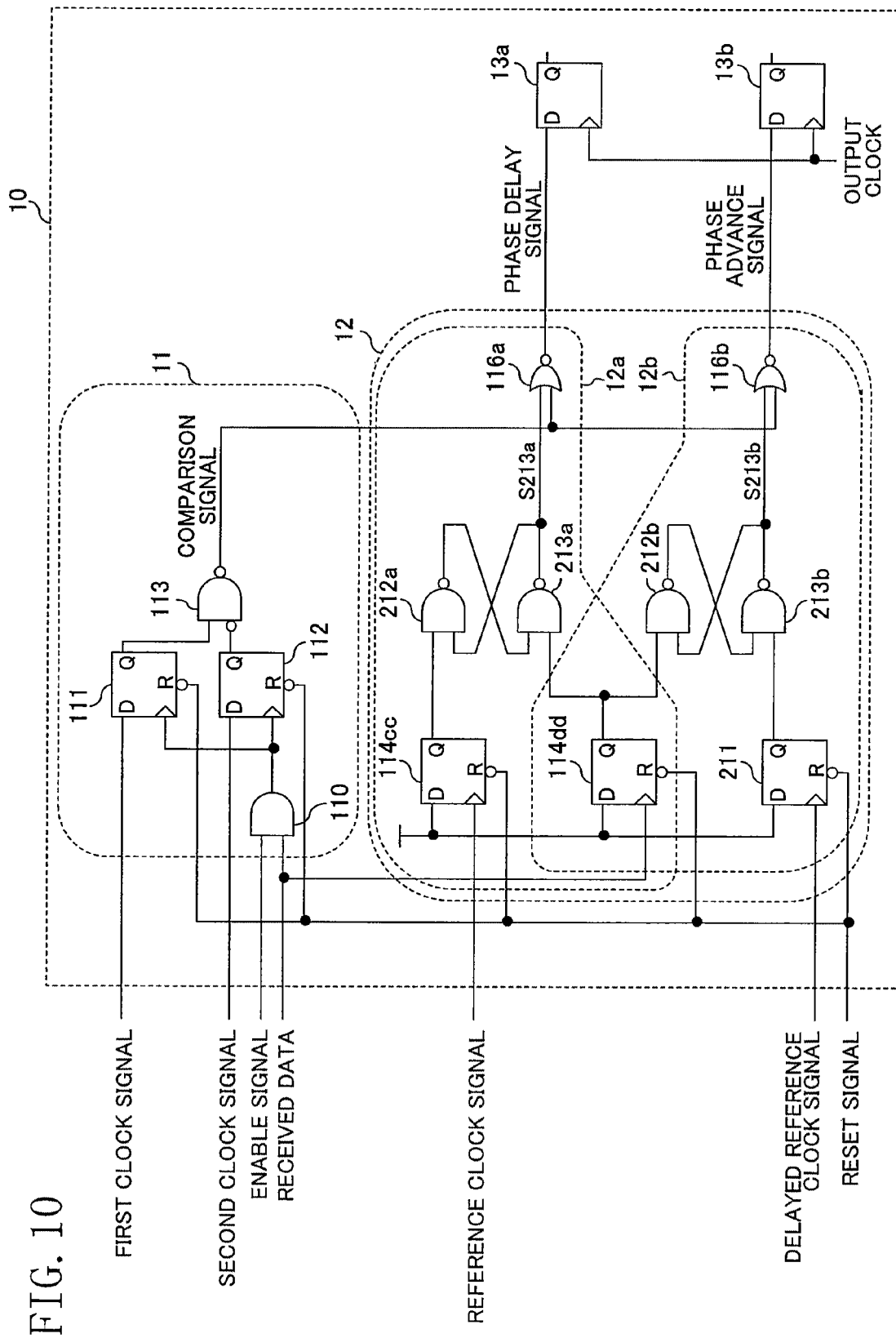
FIG. 10 is a circuit diagram showing a variation of the phase comparator of FIG. 8.

FIG. 10 shows a variation of the phase comparator 10 of FIG. 8. Here, a delay flip-flop is used in each of the comparison period detecting unit 11, the phase delay detecting unit 12a, and the phase advance detecting unit 12b. Note that the comparison period detecting unit 11 is similar to that of FIG. 7.

The phase delay detecting unit 12a includes a flip-flop (reference point detecting unit) 114cc, a flip-flop (transition point detecting unit) 114dd, NAND circuits 212a and 213a constituting an RS latch, and a NOR circuit 116a. The phase advance detecting unit 12b includes a flip-flop (transition point detecting unit) 114dd, a flip-flop (delayed reference point detecting unit) 211, NAND circuits 212b and 213b constituting an RS latch, and a NOR circuit 116b. Here, the phase delay detecting unit 12a and the phase advance detecting unit 12b share the transition point detecting unit 114dd.

The RS latch including the NAND circuits 212a and 213a, when the output of the transition point detecting unit 114dd goes to the "H level" earlier than the output of the reference point detecting unit 114cc, causes its output corresponding to the NOR circuit 116a (first internal signal S213a) to go to the "L level", and when otherwise, causes the first internal signal S213a to go to the "H level". The NOR circuit 116a, when both the first internal signal S213a and the comparison signal are at the "L level", causes its output to go to the "H level" (i.e., a phase delay signal is output).

The delayed reference point detecting unit 211 holds the "H level" in synchronization with a rising edge of a delayed reference clock signal. The RS latch including the NAND circuits 212b and 213b, when the output of the delayed reference point detecting unit 211 goes to the "H level" earlier than the output of the transition point detecting unit 114dd, causes its output corresponding to the NOR circuit 116b (second internal signal S213b) to go to the "L level", and when otherwise, causes the second internal signal S213b to go to the "H level". The NOR circuit 116b, when both the second internal signal S213b and the comparison signal are at the "L level", causes its output to go to the "H level" (i.e., a phase advance signal is output).

<Operation>

As shown in FIG. 9, when a rising edge of received data occurs during a period P1, the output of the transition point detecting unit 114dd goes to the "H level" earlier than the output of the reference point detecting unit 114cc in the phase delay detecting unit 12a, so that a phase delay signal is output.

When a rising edge of received data occurs during a period P2, the output of the reference point detecting unit 114cc goes to the "H level" earlier than the output of the transition point detecting unit 114dd in the phase delay detecting unit 12a, so that a phase delay signal is not output. On the other hand, in the phase advance detecting unit 12b, the output of the transition point detecting unit 114dd goes to the "H level" earlier than the output of the delayed reference point detecting unit 211, so that a phase advance signal is not output.

When a rising edge of received data occurs during a period P3, the output of the delayed reference point detecting unit 211 goes to the "H level" earlier than the output of the transition point detecting unit 114dd in the phase advance detecting unit 12b, so that a phase advance signal is output.

The outputs of the comparison period detecting unit 11, the phase delay detecting unit 12a, and the phase advance detecting unit 12b are each held until a reset signal goes to the "L level", and are cleared (goes to the "L level") when the reset signal goes to the "L level".

<Effect>

With this configuration, the D inputs of the delay flip-flops of the transition point detecting unit 114dd and the reference point detecting unit 114cc are pulled up to a power supply, so that rising timings of received data and a reference clock signal can be evaluated without considering a setup constraint.

Third Embodiment

Configuration

The configurations of a clock data recovery system and a phase adjusting unit 3 according to a third embodiment of the present invention are similar to those of FIGS. 1 and 2, except for the phase comparator 10. Each phase comparator 10 detects the presence or absence of a "phase delay" by comparing the phases of received data and a reference clock signal, and detects the presence or absence of a "phase advance" by comparing the phases of received data (delayed data) delayed by a predetermined period and a reference clock signal.

<Configuration of Phase Comparator>

Figure 11:
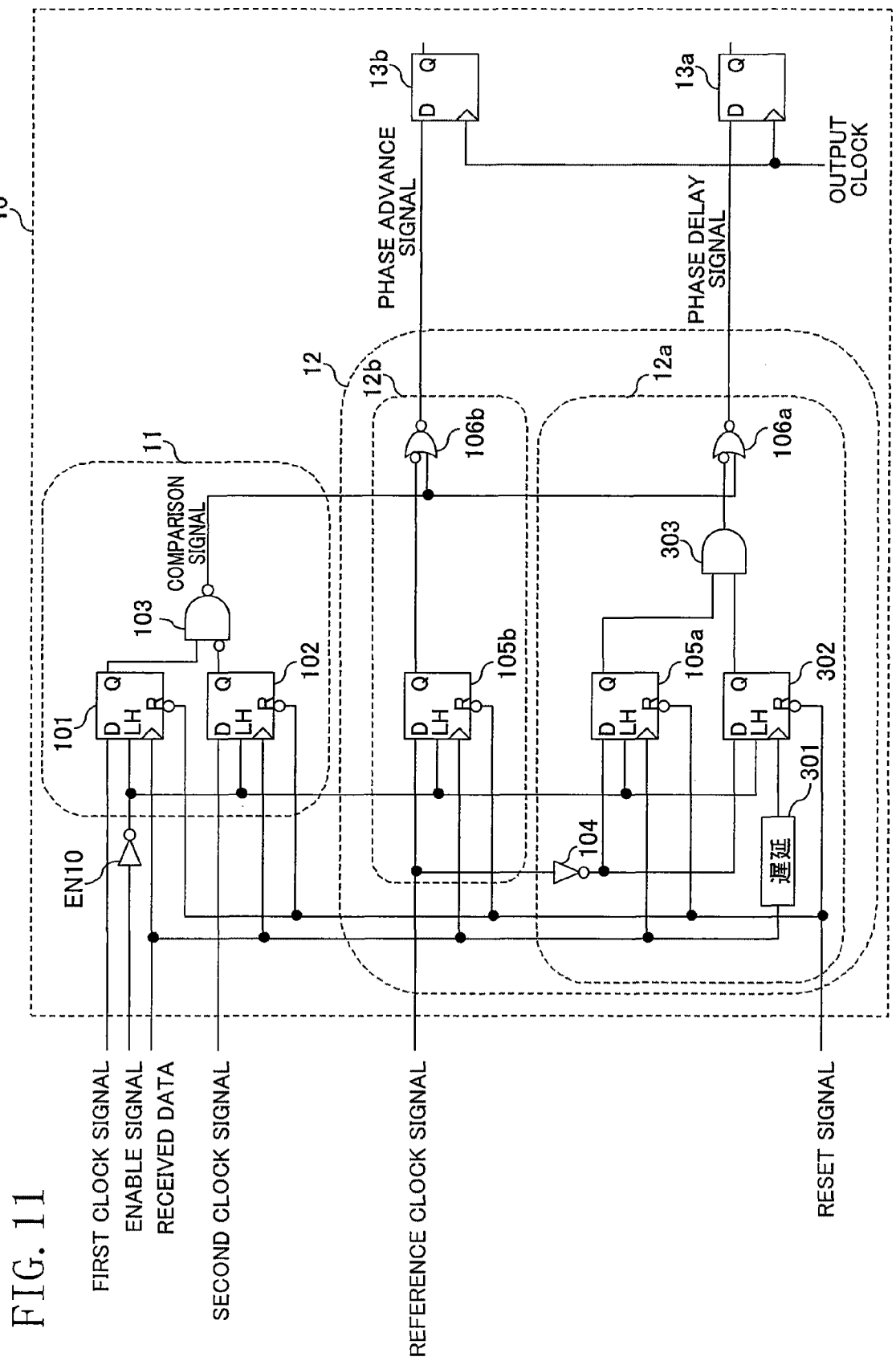
FIG. 11 is a diagram showing a configuration of a phase comparator according to a third embodiment of the present invention.

FIG. 11 shows a configuration of a phase comparator 10 according to the third embodiment of the present invention. In the phase comparator 10, a phase delay detecting unit 12b includes a delay element 301, a flip-flop 302, and an AND circuit 303 in addition to the phase delay detecting unit 12b of FIG. 3. The other configuration is similar to that of FIG. 3.

The delay element 301 delays received data by a predetermined period and outputs delayed data. Note that a delay amount in the delay element 301 is "D (0<D<i)". The flip-flop 302 receives an inverted signal of a reference clock signal and the delayed data from the delay element 301, and holds the inverted signal of the reference clock signal in synchronization with a rising edge of the delayed data. The AND circuit 303, when both the output of the flip-flop 105a and the output of the flip-flop 302 are at the "H level", causes its output to go to the "H level", and when otherwise, causes its output to go to the "L level". The logic circuit 106a, when the comparison signal from the comparison period detecting unit 11 is at the "L level" and the output of the AND circuit 303 is at the "H level", causes its output to go to the "H level" (i.e., a phase delay signal is output).

<Operation of Phase Comparator>

Figure 12:
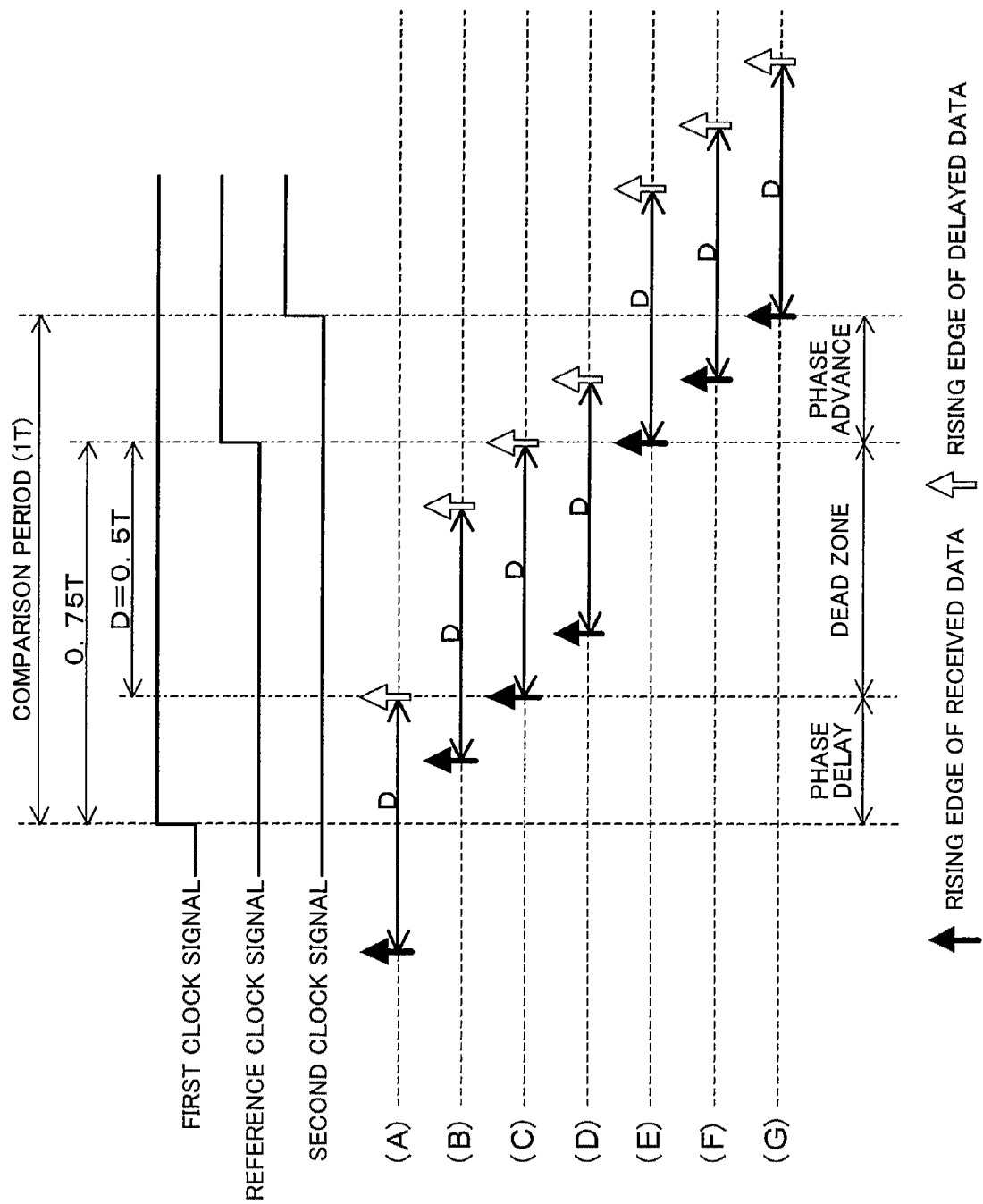
FIG. 12 is a diagram for describing an operation of the phase comparator of FIG. 11.

An operation of the phase comparator 10 of FIG. 11 will be described with reference to FIG. 12. In FIG. 12, attention is paid to a comparison period that is defined using rising edges of the first and second clock signals. Note that it is assumed that the phase of a reference clock signal is delayed by "0.75 T" from the first clock signal, and a delay amount D in the delay element 301 is "0.5 T".

In the case of (A) and (B), since a rising edge of received data occurs earlier than a rising edge of the reference clock signal, the output of the flip-flop 105a of the phase delay detecting unit 12a goes to the "H level". Also, since a rising edge of delayed data occurs earlier than the rising edge of the reference clock signal, the output of the flip-flop 302 of the phase delay detecting unit 12a also goes to the "H level". Therefore, a phase delay signal is output. Note that, as shown in (A), when the rising edge of the received data occurs earlier than the start point of a comparison period, the comparison signal does not go to the "L level", so that a phase delay signal is not output.

In the case of (C) and (D), since a rising edge of received data occurs earlier than the rising edge of the reference clock signal, the output of the flip-flop 105a of the phase delay detecting unit 12a goes to the "H level". However, since a rising edge of delayed data occurs later than the rising edge of the reference clock signal, the output of the flip-flop 302 of the phase delay detecting unit 12a goes to the "L level", so that a phase delay signal is not output. On the other hand, since the output of the flip-flop 105b of the phase advance detecting unit 12b is at the "L level", a phase advance signal is not output. Thus, neither a phase delay signal nor a phase advance signal is output.

In the case of (E), (F) and (G), since a rising edge of received data occurs later than the rising edge of the reference clock signal, the output of the flip-flop 105a of the phase delay detecting unit 12a is at the "L level". On the other hand, since the output of the flip-flop 105b of the phase advance detecting unit 12b goes to the "H level", a phase advance signal is output.

As described above, a phase delay signal is output during a period from a "start point of a comparison period" to a "time point that is a period corresponding to the delay amount D before a rising edge of a reference clock signal". A period from a "time point that is a period corresponding to the delay amount D before a rising edge of a reference clock signal" to a "rising edge of a reference clock signal" is a dead zone. A phase advance signal is output during a period from a "rising edge of a reference clock signal" to an "end point of a comparison period".

<Delay Amount of Delay Element>

Note that a delay amount in the delay element 301 and a phase difference between a first clock signal and a reference clock signal are not limited to the numerical values described above. Taking the symmetry of the phase determining process into consideration, the delay amount D of the delay element 301 is preferably "smaller than or equal to T/2", and the phase of the reference clock signal is preferably delayed by "(T+D)/2" from the first clock signal.

<Effect>

As described above, by forming a dead zone using a reference clock signal and delayed data, endurance against jitter is improved. Moreover, a smaller number of delay elements are required as compared to conventional phase comparators, so that an influence of fluctuation of a power supply voltage or temperature can be reduced.

Note that, instead of providing a delay element 301 for each of the n phase comparators 10, a delay element for generating delayed data may be newly provided in the clock data recovery system, and both received data and delayed data may be supplied to each of the phase comparators 10. In this case, a similar effect is obtained.

(Variation of Phase Comparator of Third Embodiment)

Note that, when the enable signal goes to the "H level" before the start point of the comparison period, the flip-flop with a load/hold mode switching function can be replaced with a general delay flip-flop as in the first embodiment.

<Configuration>

Figure 13:
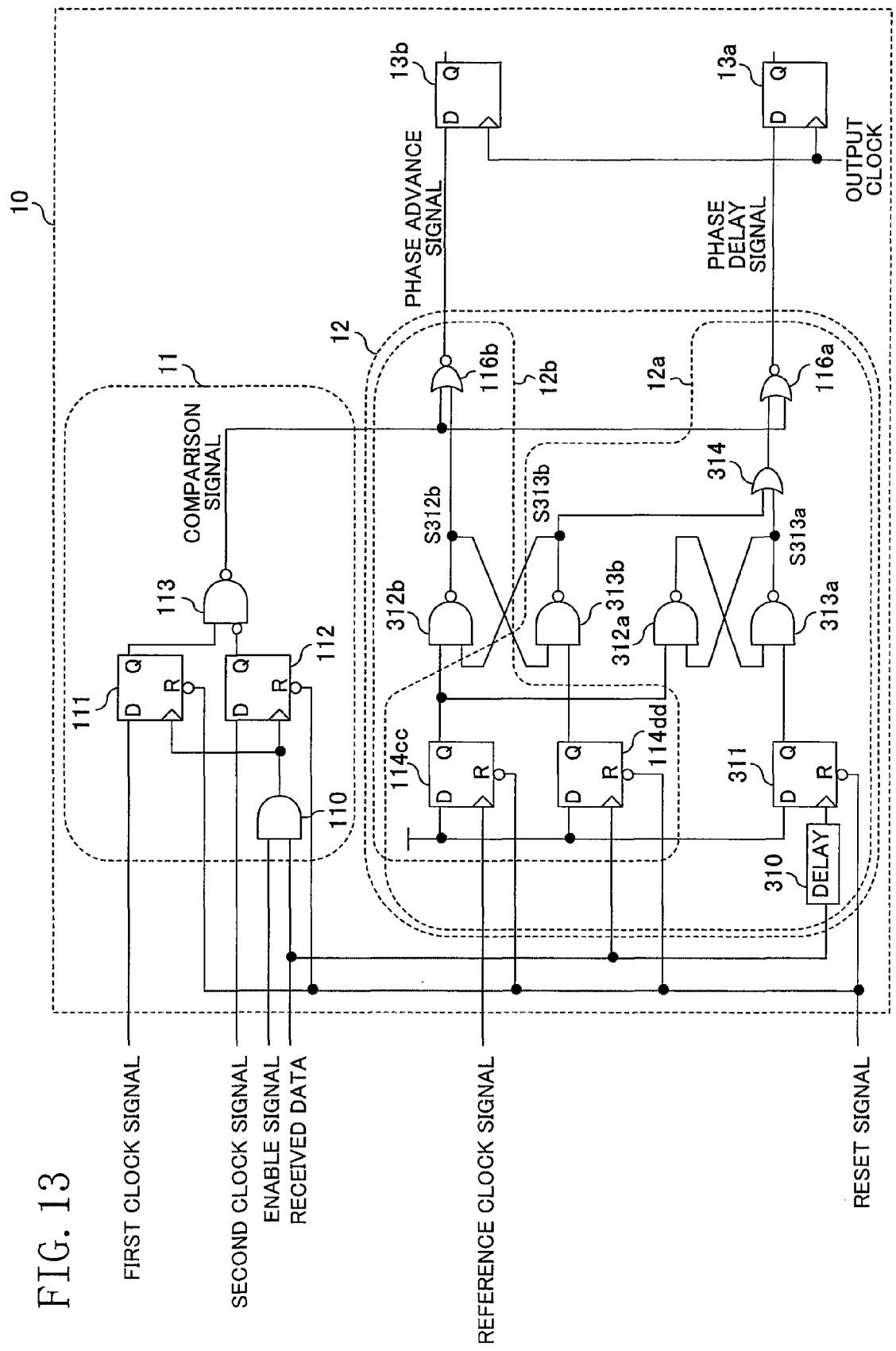
FIG. 13 is a circuit diagram showing a variation of the phase comparator of FIG. 11.

FIG. 13 shows a variation of the phase comparator of FIG. 11. The phase delay detecting unit 12a includes a flip-flop (reference point detecting unit) 114ce, a flip-flop (transition point detecting unit) 114dd, a delay element 310, a flip-flop (delayed transition point detecting unit) 311, NAND circuits 313b, 312a and 313a, an OR circuit 314, and a NOR circuit 116a. The phase advance detecting unit 12b includes a flip-flop (reference point detecting unit) 114cc, a flip-flop (transition point detecting unit) 114dd, a NAND circuit 312b, and a NOR circuit 116b. Here, the phase delay detecting unit 12a and the phase advance detecting unit 12b share the reference point detecting unit 114cc and the transition point detecting unit 114dd.

The RS latch including the NAND circuits 312a and 313a, when the output of the delayed transition point detecting unit 311 goes to the "H level" earlier than the output of the reference point detecting unit 114cc, causes its output (first internal signal S313a) corresponding to the OR circuit 314 to go to the "L level", and when otherwise, causes the first internal signal S313a to go to the "H level". The RS latch including the NAND circuits 312b and 313b, when the output of the reference point detecting unit 114cc goes to the "H level" earlier than the output of the transition point detecting unit 114dd, causes its output (second internal signal S312b) corresponding to the NOR circuit 116b to go to the "L level", and when the output of the transition point detecting unit 114dd goes to the "H level" earlier, causes its output (phase delay prediction signal S313b) corresponding to the OR circuit 314 to go to the "L level". The OR circuit 314, when both the first internal signal S313a and the phase delay prediction signal S313b are at the "L level", causes its output to go to the "L level", and when otherwise, causes its output to go to the "H level".

The NOR circuit 116a, when both the comparison signal and the output of the OR circuit 314 are at the "L level", causes its output to go to the "H level" (i.e., a phase delay signal is output). The NOR circuit 116b, when both the comparison signal and the second internal signal S312b are at the "L level", causes its output to go to the "H level" (i.e., a phase advance signal is output).

<Operation>

As shown in (A) and (B) of FIG. 12, when a rising edge of received data occurs earlier than a rising edge of a reference clock signal, the output of the delayed transition point detecting unit 311 goes to the "H level" earlier than the output of the reference point detecting unit 114cc, so that the first internal signal S313a goes to the "L level", in the phase relationship detecting unit 12. On the other hand, since the output of the transition point detecting unit 114dd goes to the "H level" earlier than the output of the reference point detecting unit 114cc, the second internal signal S312b remains at the "H level", and the phase delay prediction signal S313b goes to the "L level". Therefore, the output of the OR circuit 314 goes to the "L level", so that a phase delay signal is output.

As shown in (C) and (D) of FIG. 12, when a rising edge of received data occurs earlier than the rising edge of the reference clock signal, the output of the reference point detecting unit 114cc goes to the "H level" earlier than the output of the delayed transition point detecting unit 311, so that the first internal signal S313a remains at the "H level". On the other hand, since the output of the transition point detecting unit 114dd goes to the "H level" earlier than the output of the reference point detecting unit 114cc, the phase delay prediction signal S313b goes to the "L level". Therefore, the output of the OR circuit 314 remains at the "H level", so that a phase delay signal is not output. Also, since the second internal signal S312b remains at the "H level", a phase advance signal is not output. Thus, neither a phase delay signal nor a phase advance signal is output.

As shown in (E), (F) and (G) of FIG. 12, when a rising edge of received data occurs later than the rising edge of the reference clock signal, the output of the reference point detecting unit 114cc goes to the "H level" earlier than the output of the transition point detecting unit 114dd, so that the second internal signal S312b goes to the "L level". Therefore, a phase advance signal is output.

The outputs of the comparison period detecting unit 11, the phase delay detecting unit 12a and the phase advance detecting unit 12b are each held until a reset signal goes to the "L level", and are each cleared (goes to the "L level") when the reset signal goes to the "L level".

<Effect>

With this configuration, the D inputs of the delay flip-flops of the transition point detecting unit 114dd and the reference point detecting unit 114cc are pulled up to a power supply, so that rising timings of received data and a reference clock signal can be evaluated without considering a setup constraint.

Fourth Embodiment

Configuration of Clock Data Recovery System

The configurations of a clock data recovery system and a phase adjusting unit according to a fourth embodiment of the present invention are similar to those of FIGS. 1 and 2, except for the configuration of the phase comparator 10.

Figure 14:
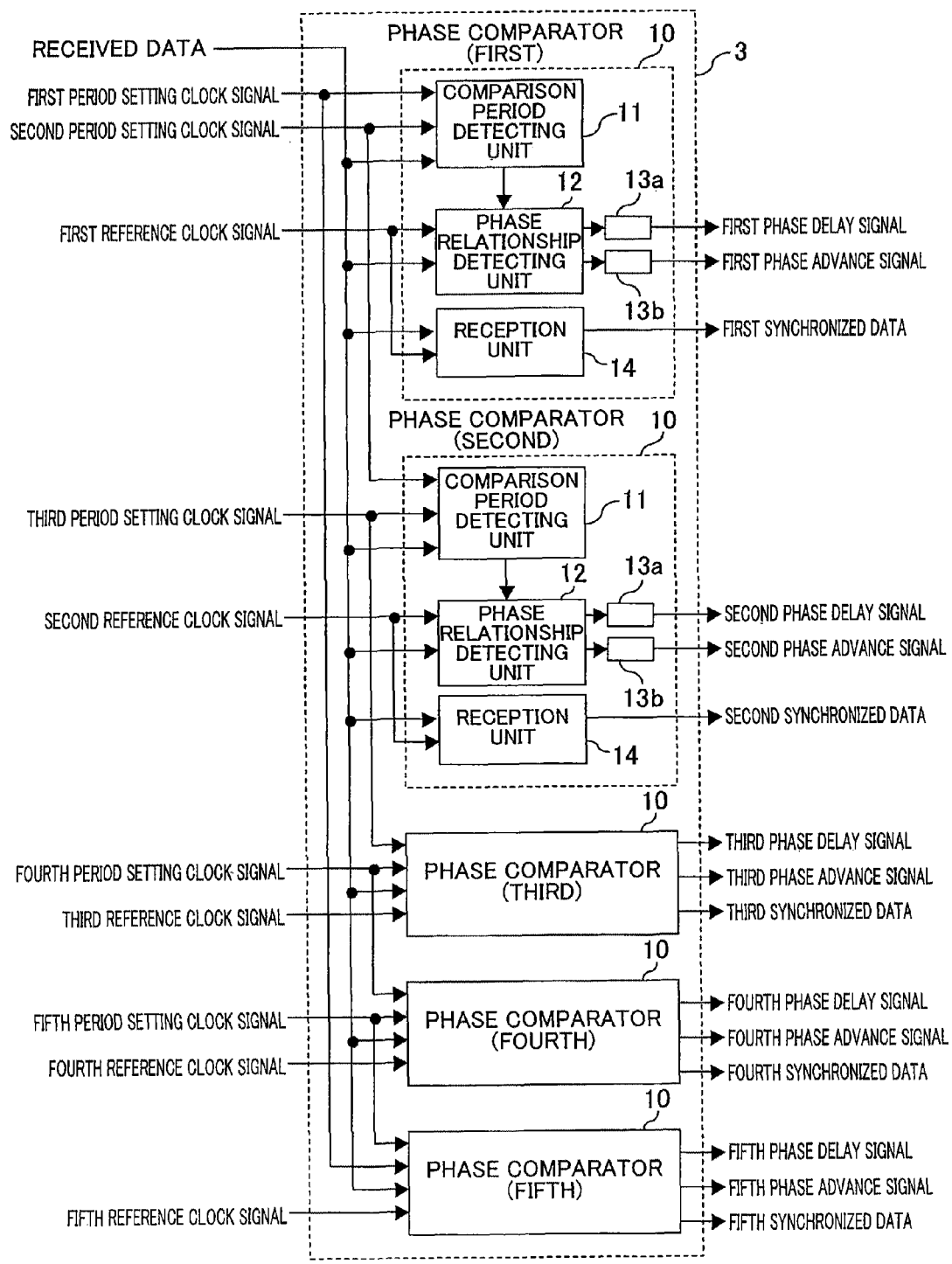
FIG. 14 is a block diagram showing a configuration of a phase adjusting unit according to a fourth embodiment of the present invention.

FIG. 14 shows a configuration of a phase adjusting unit 3 of this embodiment. A p-th phase comparator 10 receives a p-th one of n period setting clock signals as a first clock signal, and receives a second clock signal whose phase is delayed by "h" from the first clock signal (in FIG. 14, a q-th period setting clock signal whose phase is delayed by "1 T" from the p-th period setting clock signal as the first clock signal). The p-th phase comparator 10 also receives a reference clock signal whose phase is delayed by "i" from the first clock signal, of n reference clock signals (in FIG. 14, a p-th reference clock signal corresponding to the p-th period setting clock signal as the first clock signal). For example, the first phase comparator 10 receives a first period setting clock signal as the first clock signal, a second period setting clock signal as the second clock signal, and a first reference clock signal corresponding to the first period setting clock signal.

Also, in each phase comparator 10, the phase relationship detecting unit 12, when a rising edge of a reference clock signal occurs in time before a rising edge of received data, detects a "phase delay". Also, the phase relationship detecting unit 12, when a rising edge of a reference clock signal occurs in time after a rising edge of received data, detects a "phase advance". Thus, in the phase comparator of this embodiment, the detection result of the phase relationship is opposite to that of the phase comparators of the first to third embodiments. Thereby, in the clock data recovery system of this embodiment, a phase control is performed so that, as a rising edge of received data becomes closer to a rising edge of a reference clock signal, the rising edge of the reference clock signal is caused to be farther away from the rising edge of received data.

Here, the reception unit 14 of each phase comparator 10 receives a reference clock signal as a latch clock, and holds received data in synchronization with the reference clock signal and outputs the held received data as synchronized data.

<Configuration of Phase Comparator>

Figure 15:
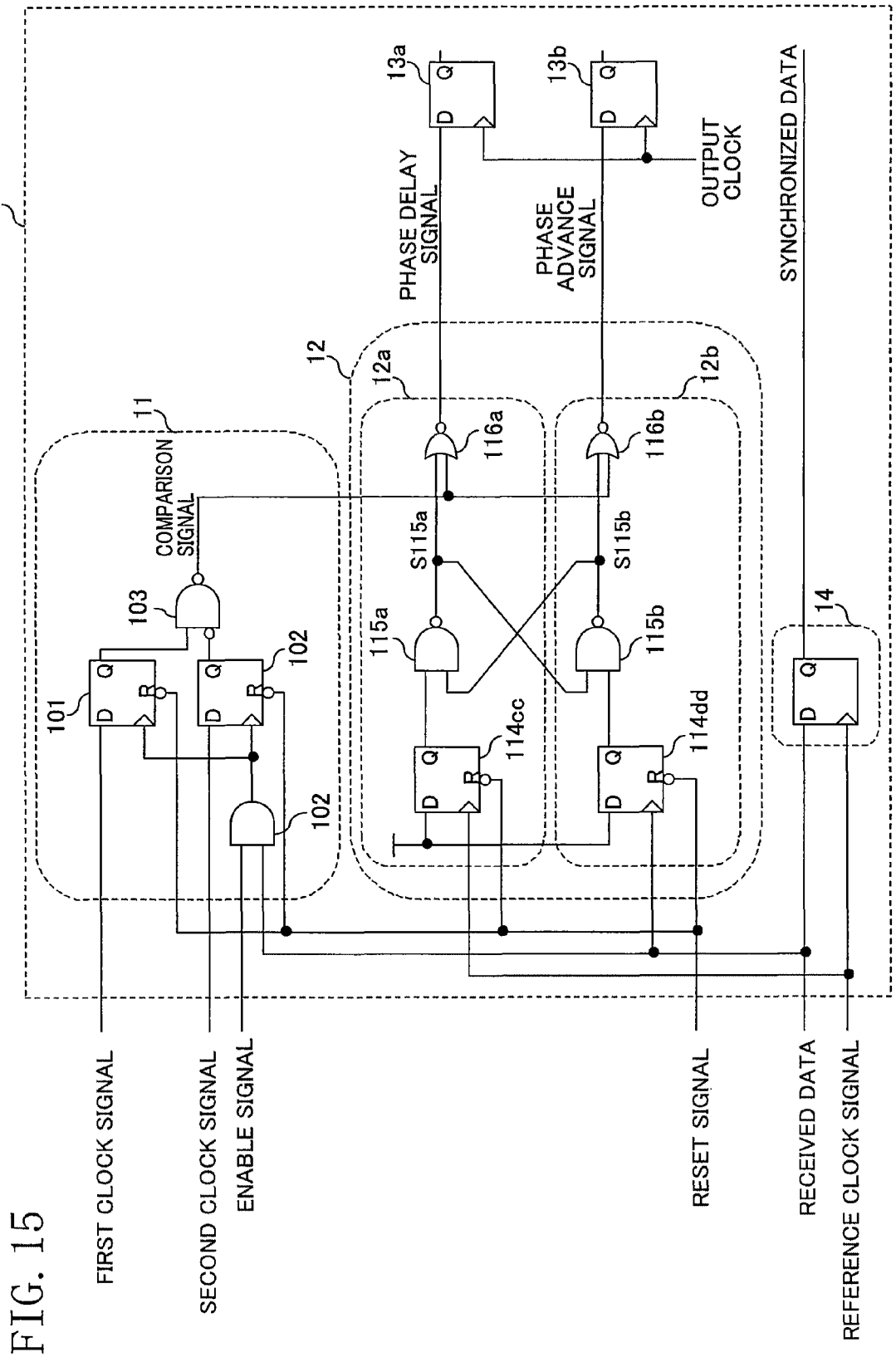
FIG. 15 is a circuit diagram showing a configuration of the phase comparator of FIG. 14.

FIG. 15 shows a configuration of the phase comparator of the fourth embodiment of the present invention. In this phase comparator, the phase delay detecting unit 12a includes a reference point detecting unit 114cc instead of the transition point detecting unit 114dd. The phase advance detecting unit 12b includes a transition point detecting unit 114dd instead of the reference point detecting unit 114cc. Note that, here, the reception unit 14 receives a reference clock signal instead of the second clock signal. The other configuration is similar to that of FIG. 7.

<Operation>

Figure 16:
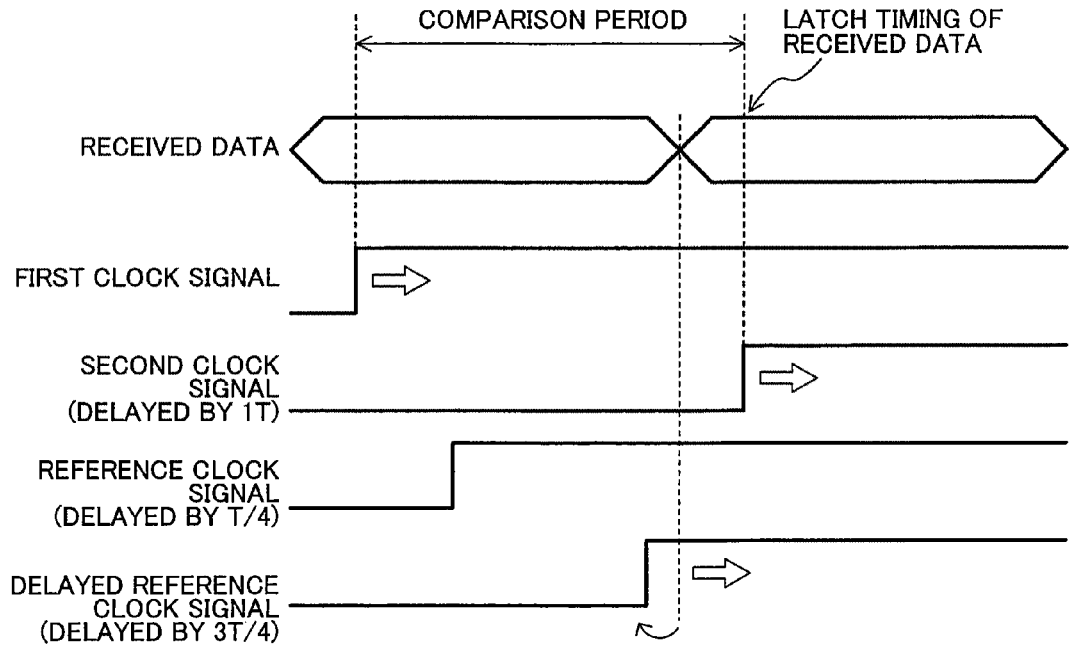
FIG. 16 is a diagram for describing an operation of the phase comparator of FIG. 10.
Figure 17:
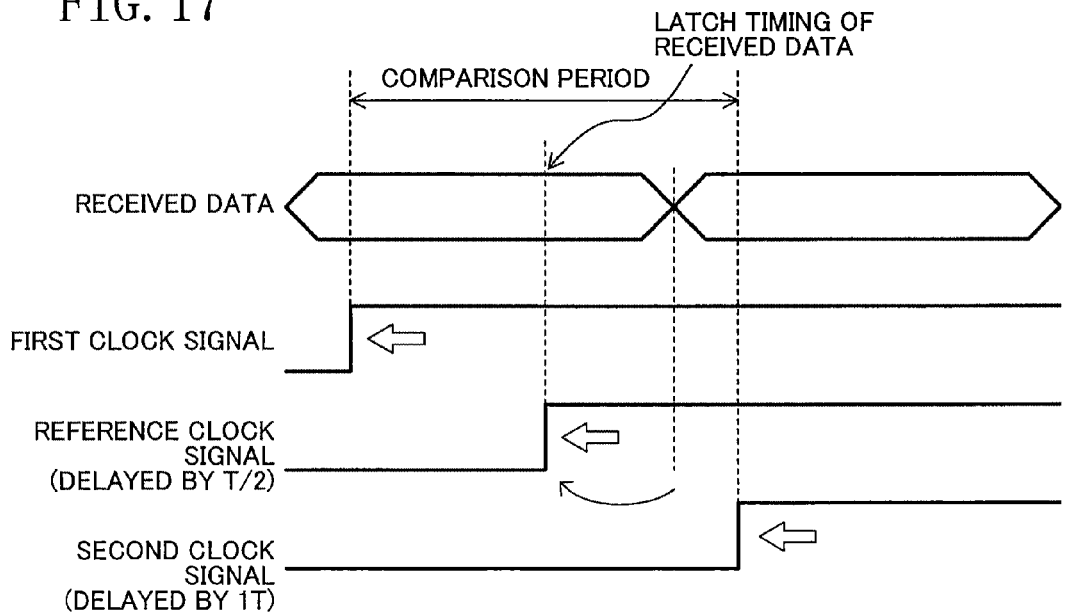
FIG. 17 is a diagram for describing an operation of the phase comparator of FIG. 15.

An operation of the phase comparator 10 of FIG. 15 will be described while comparing FIG. 16 and FIG. 17. FIG. 16 is a diagram showing an operation of the phase comparator of FIG. 10, and FIG. 17 is a diagram showing an operation of the phase comparator of FIG. 15. Note that, in FIG. 17, the phase of the second clock signal is delayed by "1 T" from the first clock signal, and the reference clock signal is delayed by "T/2" from the first clock signal.

In the case of FIG. 16, during a comparison period, when a rising edge of a delayed reference clock signal occurs in time before a rising edge of received data, the phase comparator 10 outputs a phase advance signal. The phase control unit 4 increases a number indicated by a phase selection signal, depending on the phase advance signal from the phase comparator 10. Thereby, the phases of clock signals (n period setting clock signals and n reference clock signals) output from the multi-phase clock selecting unit 2 are delayed. Thereby, the rising edge of the delayed reference clock signal becomes closer to the rising edge of the received data, a rising edge of the second clock signal (latch clock) is shifted toward a middle portion (a portion having a well open data eye) between transition points of received data.

In the case of FIG. 17, during a comparison period, when a rising edge of a reference clock signal occurs in time before a rising edge of received data, the output of the reference point detecting unit 114cc goes to the "H level" earlier than the output of the transition point detecting unit 114dd, so that the output of the phase delay detecting unit 12a goes to the "H level" (i.e., a phase delay signal is output). The phase control unit 4 decreases a number indicated by a phase selection signal, depending on the phase delay signal from the phase comparator 10. Thereby, the phases of clock signals output from the multi-phase clock selecting unit 2 are advanced. Conversely, when a rising edge of a reference clock signal occurs in time after a rising edge of received data, a phase advance signal is output from the phase comparator 10, so that the phases of clock signals output from the multi-phase clock selecting unit 2 are delayed. Thus, the phase of a reference clock signal is adjusted so that a rising edge of the reference clock signal is provided at a time point that is located a predetermined period away from a rising edge of received data. In other words, a rising edge of a reference clock signal is provided at a middle portion of transition points of received data, so that received data can be correctly held in synchronization with a rising edge of a reference clock signal.

<Delay Amount of Second Clock Signal>

As shown in FIG. 17, when a phase comparison process is executed during the entirety of a period (1 T) corresponding to one bit of received data, a clock signal whose phase is delayed by "T/2" from the first clock signal may be used as a reference clock signal, and a clock signal whose phase is delayed by "1 T" from the first clock signal may be used as a second clock signal. In this case, as in the first to third embodiments, the first period setting clock signal (third main clock) may be used as the first clock signal, and the first reference clock signal (seventh main clock) may be used as the first reference clock signal, and the second period setting clock signal (eleventh main clock) may be used as the second clock signal.

Figure 18:
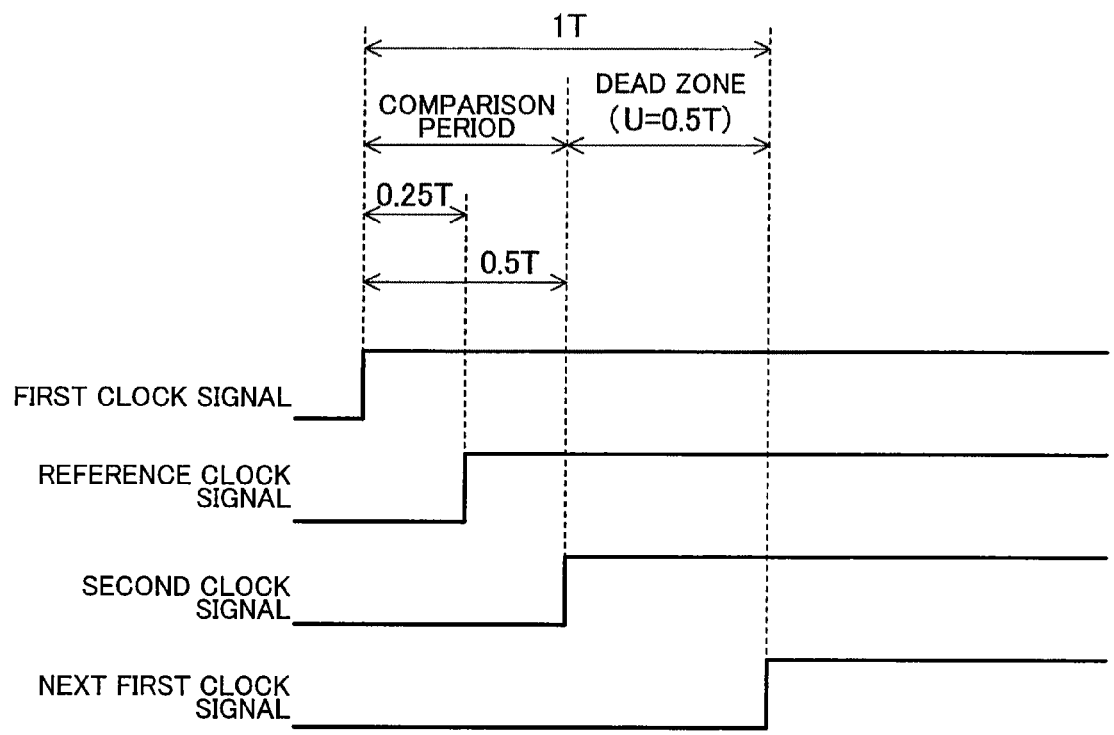
FIG. 18 is a diagram showing a phase relationship between each clock signal when a dead zone is set in the phase comparator of FIG. 15.

Also, as shown in FIG. 18, when a dead zone having a range U is set, the phase of a reference clock signal may be delayed by "(T−U)/2" from the first clock signal, and therefore, the phase of the second clock signal may be delayed by "T−U" from the first clock signal. In this case, the second clock signal may be generated by delaying a period setting clock signal that is the first clock signal using a delay element, or may be achieved by selecting a main clock that is delayed by a predetermined number of phases from the first clock signal (period setting clock signal) in the multi-phase clock selecting unit 2. Also, when the symmetry of the phase determining process is considered, it is optimal when "U=0.5 T". In other words, it is optimal when the phase of the second clock signal is delayed by "0.5 T" from the first clock signal, and the phase of the reference clock signal is delayed by "0.25 T" from the first clock signal.

<Effect>

As described above, phase adjustment is performed so that a rising edge of a reference clock signal is shifted to a portion having a well open data eye, and received data is received in synchronization with a rising edge of the reference clock signal, thereby making it possible to correctly hold the received data.

Fifth Embodiment

Although it has been described in the embodiments above that a phase relationship between a rising edge of a reference clock signal and a rising edge of received data is detected, a falling edge of received data may be used in a phase comparison process. Thus, by using both rising and falling edges of received data in phase determination, response characteristics of a clock data recovery system can be doubled as compared to when only one of them is used in a phase comparison process. In order to use both edges in a phase comparison process, a flip-flop may be configured to operate in synchronization with both edges of received data. In this case, however, the margin of the speed of the flip-flop is "½" of that which is obtained when only one edge is used in a phase comparison process.

<Configuration of Clock Data Recovery System>

Figure 19:
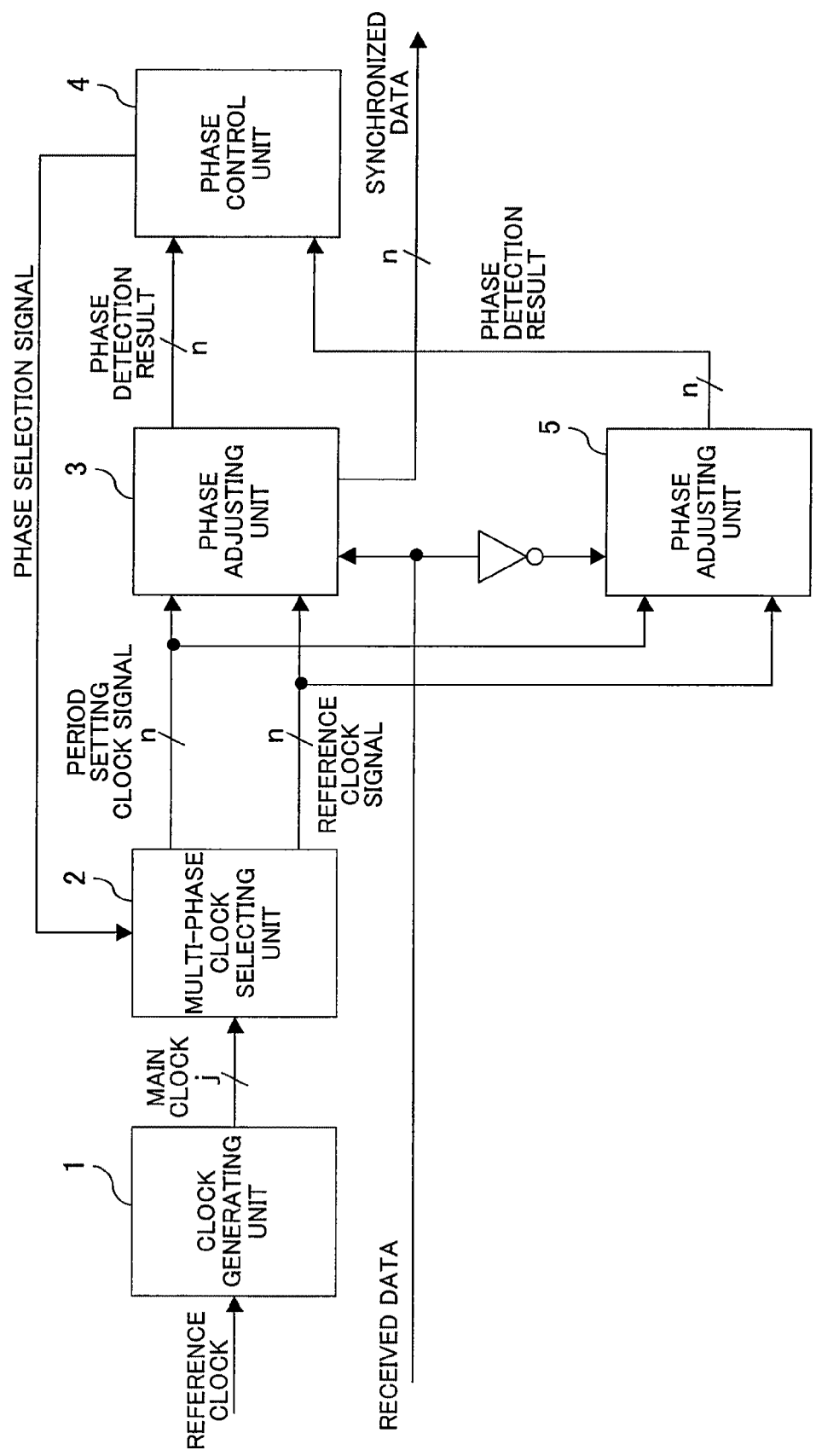
FIG. 19 is a block diagram showing a configuration of a clock data recovery system according to a fifth embodiment of the present invention.

FIG. 19 shows a configuration of a clock data recovery system according to a fifth embodiment of the present invention. This system includes a phase adjusting unit 5 in addition to the clock data recovery system of FIG. 1. The phase adjusting unit 5 has a configuration similar to that of the phase adjusting unit 3. For example, if the phase comparator 10 of the phase adjusting unit 3 has the configuration of FIG. 3, the phase comparator 10 of the phase adjusting unit 5 also has the configuration of FIG. 3. Note that the phase comparators of the first to fourth embodiments are applicable in addition to the configuration of FIG. 3. Note that the reception unit 14 that outputs synchronized data may be included in either of the phase adjusting units 3 and 5. The phase adjusting unit 5 receives inverted received data, and n period setting clock signals and n reference clock signals from the multi-phase clock selecting unit 2, and outputs n phase detection results.

Here, the phase adjusting unit 3 detects a phase relationship based on a rising edge of received data and a rising edge of a reference clock signal, while the phase adjusting unit 5 detects a phase relationship based on a falling edge of the received data and a rising edge of the reference clock signal.

The phase adjusting units 3 and 5 will be described in detail. In each phase comparator 10 of the phase adjusting unit 3, the comparison period detecting unit 11 outputs a comparison signal when received data goes from "L level" to the "H level" during a comparison period that is defined by a rising edge of the first clock signal and a rising edge of the second clock signal. The phase delay detecting unit 12a, when a rising edge of a reference clock signal occurs earlier than a rising edge of received data, determines that there is a "phase delay". The phase advance detecting unit 12b, when a rising edge of a reference clock signal occurs later than a rising edge of received data, determines that there is a "phase advance".

On the other hand, in each phase comparator 10 of the phase adjusting unit 3, the comparison period detecting unit 11, when received data goes from the "H level" to the "L level" during a comparison period, outputs a comparison signal. The phase delay detecting unit 12a, when a rising edge of a reference clock signal occurs earlier than a falling edge of the received data, determines that there is a "phase delay". The phase advance detecting unit 12b, when a rising edge of a reference clock signal occurs later than a falling edge of the received data, determines that there is a "phase advance".

The phase control unit 4 receives a phase detection result from each of the phase adjusting units 3 and 5, and performs a logical operation of these phase detection results, which is used in a control of a phase selection signal.

<Operation>

Next, an operation of the clock data recovery system of FIG. 19 will be described.

When a rising edge of received data occurs, the phase adjusting unit 3 detects a phase relationship between the received data and a reference clock signal, and outputs a phase detection result to the phase control unit 4. The phase control unit 4 changes the phase selection signal based on the phase detection result from the phase adjusting unit 3.

On the other hand, when a falling edge of received data occurs, the phase adjusting unit 5 detects a phase relationship between the received data and the reference clock signal, and outputs a phase detection result to the phase control unit 4. The phase control unit 4 changes the phase selection signal based on the phase detection result from the phase adjusting unit 5.

Thus, the phase control unit 4 receives the phase detection results from the phase adjusting units 3 and 5 and changes the phase selection signal. In other words, a phase control can be performed based on phase information that has a resolution two times higher than when only one of a rising edge and a falling edge of received data is used in phase determination.

Note that the phase control unit 4 may execute the control of the phase selection signal every time it receives the phase detection results from the phase adjusting units 3 and 5, or may execute the control of the phase selection signal once per several cycles based on the phase detection results that are accumulated in a predetermined amount.

<Effect>

As described above, not only a rising edge of received data, but also a falling edge of the received data are used in a phase comparison process, so that response characteristics of the clock data recovery system can be improved.

(Phase Comparison Process in Phase Adjusting Unit)

Although it has been described in each of the embodiments above that the phase adjusting unit 3 executes the phase comparison process at a rate of n bits per cycle, the number of bits of received data that are processed per cycle in the phase comparison process by the phase adjusting unit 3 may be smaller than "n bits". Specifically, the phase adjusting unit 3 includes m phase comparators so as to execute the phase comparison process at a rate of m bits per cycle (m is an integer, $2 \leqq m \leqq n$). Here, when "m<n", the phase adjusting unit 3 further includes "n-m" reception units so as to output n bits of synchronized data.

Figure 20:
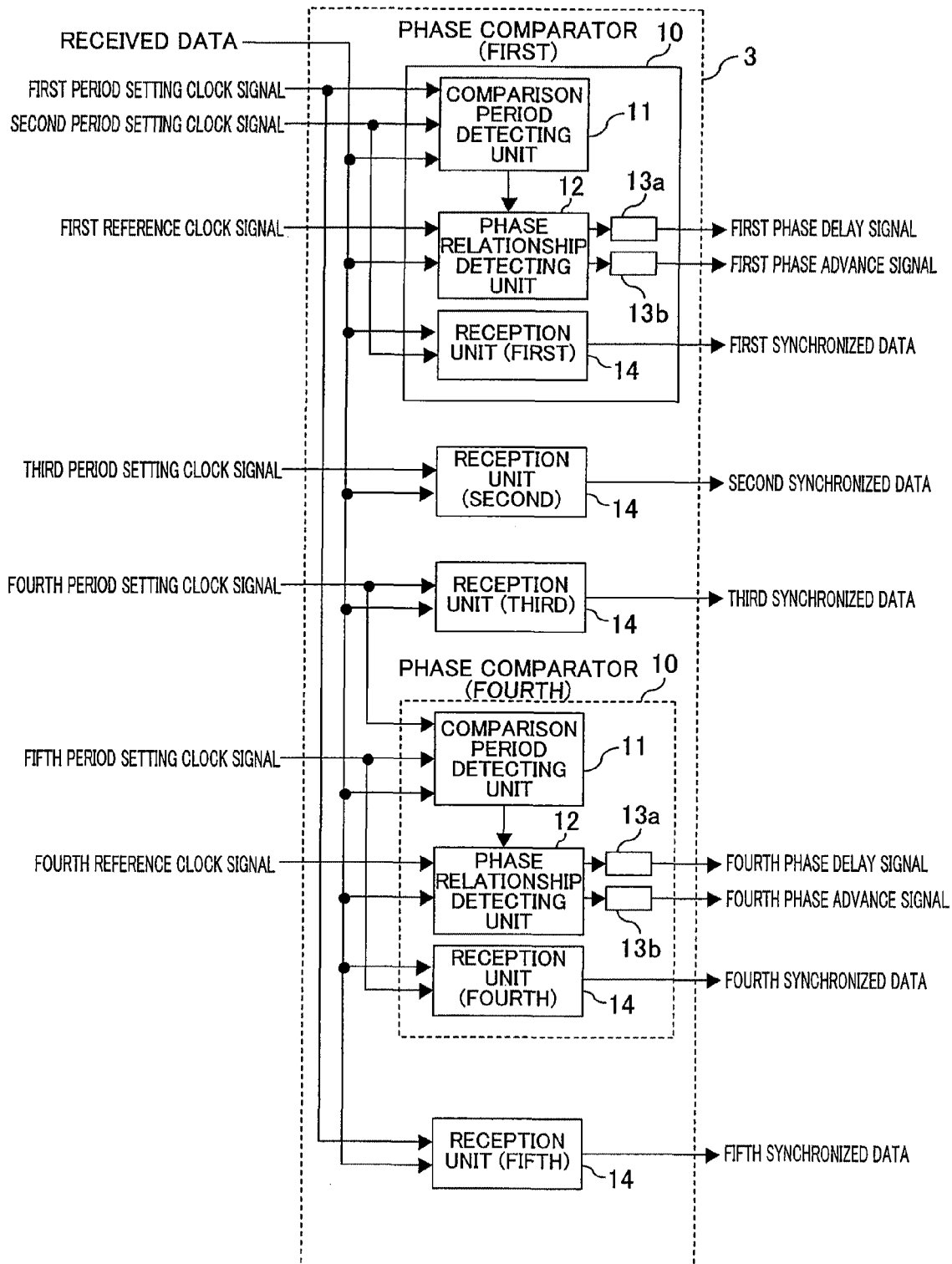
FIG. 20 is a block diagram showing a variation of the phase adjusting unit of FIG. 2.

As shown in FIG. 20, in the first to third embodiments, when "m=2", the phase adjusting unit 3 includes the second, third and fifth reception units 14 instead of the second, third and fifth phase comparators 10 of FIG. 2. A p-th the reception unit 14 receives a q-th period setting clock signal as a latch clock, and latches received data in synchronization with the received latch clock, thereby outputting synchronized data. For example, the second reception unit 14 latches received data in synchronization with the third period setting clock signal, thereby outputting second synchronized data. As shown in FIG. 20, the phase adjusting unit 3 receives n period setting clock signals (a phase difference between adjacent signals is 1 T) as a latch clock signal so as to output n bits (here, n=5) of synchronized data. The phase adjusting unit 3 also receives m of n period setting clock signals, as m first clock signals, and m second clock signals that correspond to the m first clock signals and whose phases are delayed by "1 T" from the corresponding first clock signals so as to execute the phase comparison process in an amount of m bits (here, m=2). Here, the phase adjusting unit 3 may receive m reference clock signals corresponding to the m first clock signals for the phase comparison process of m bits. For example, in FIG. 20, the phase adjusting unit 3 receives the first and fourth period setting clock signals as two first clock signals, the second and fifth period setting clock signals as two second clock signals, and the first and fourth reference clock signals.

Figure 21:
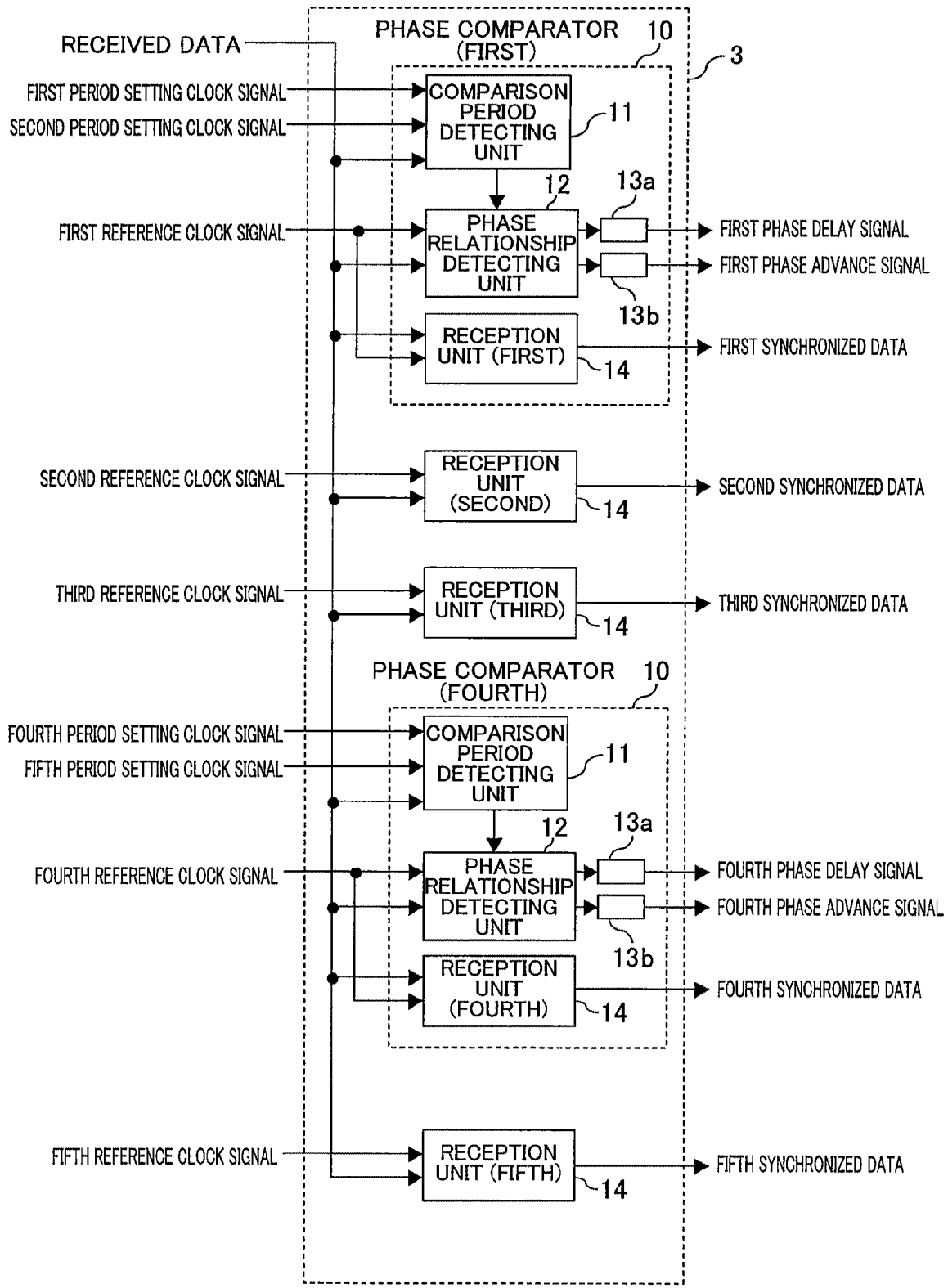
FIG. 21 is a block diagram showing a variation of the phase adjusting unit of FIG. 14.

Also, as shown in FIG. 21, in the fourth embodiment, when "m=2", the phase adjusting unit 3 includes the second, third and fifth reception units 14 instead of the second, third and fifth phase comparators 10 of FIG. 14. The p-th the reception unit 14 receives the p-th reference clock signal as a latch clock, and latches received data in synchronization with the received latch clock, thereby outputting synchronized data. For example, the second reception unit 14 latches received data in synchronization with the second reference clock signal, thereby outputting second synchronized data. As shown in FIG. 21, the phase adjusting unit 3 receives n reference clock signals as latch clock signals so as to output n bits (here, n=5) of synchronized data. A phase difference between adjacent ones of the n reference clock signals is "1 T". The phase adjusting unit 3 also receives m of the n period setting clock signal as m first clock signals, and m second clock signals that correspond to the m first clock signals and whose phases are delayed by "h" from the corresponding first clock signals (in FIG. 21, a q-th period setting clock signal whose phase is delayed by "1 T" from a p-th period setting clock signal that is a first clock signal) so as to execute the phase comparison process in an amount of m bits (here, m=2). Here, the phase adjusting unit 3 may receive m reference clock signals corresponding to the m first clock signals of the n reference clock signals (in FIG. 21, a p-th reference clock signal corresponding to a p-th period setting clock signal that is a first clock signal) so as to execute the phase comparison process in an amount of m bits.

Moreover, in the fifth embodiment, the number of bits of received data processed per cycle in the phase comparison process by the phase adjusting unit 5 may be smaller than n bits. Specifically, the phase adjusting unit 5 includes k phase comparators so as to execute a phase comparison process at a rate of k bits (k is an integer, $2 \leqq k \leqq n$) per cycle. Here, when "k<n", the phase adjusting unit 5 further includes "n-k" reception units 14 so as to output n bits of synchronized data.

(Output of Phase Delay Signal and Phase Advance Signal)

In the phase comparator described in each of the embodiments above, the phase delay signal holding unit 13a holds a phase delay signal from the phase delay detecting unit 12a, and the phase advance signal holding unit 13b holds a phase advance signal from the phase advance detecting unit 12b. Alternatively, as shown in FIGS. 22 and 23, a phase comparator 10 may include a comparison signal holding unit 133, a phase delay detection holding unit 133a and a phase advance detection holding unit 133b that are driven in synchronization with an output clock, instead of the phase delay signal holding unit 13a and the phase advance signal holding unit 13b of FIGS. 3 and 7.

Figure 22:
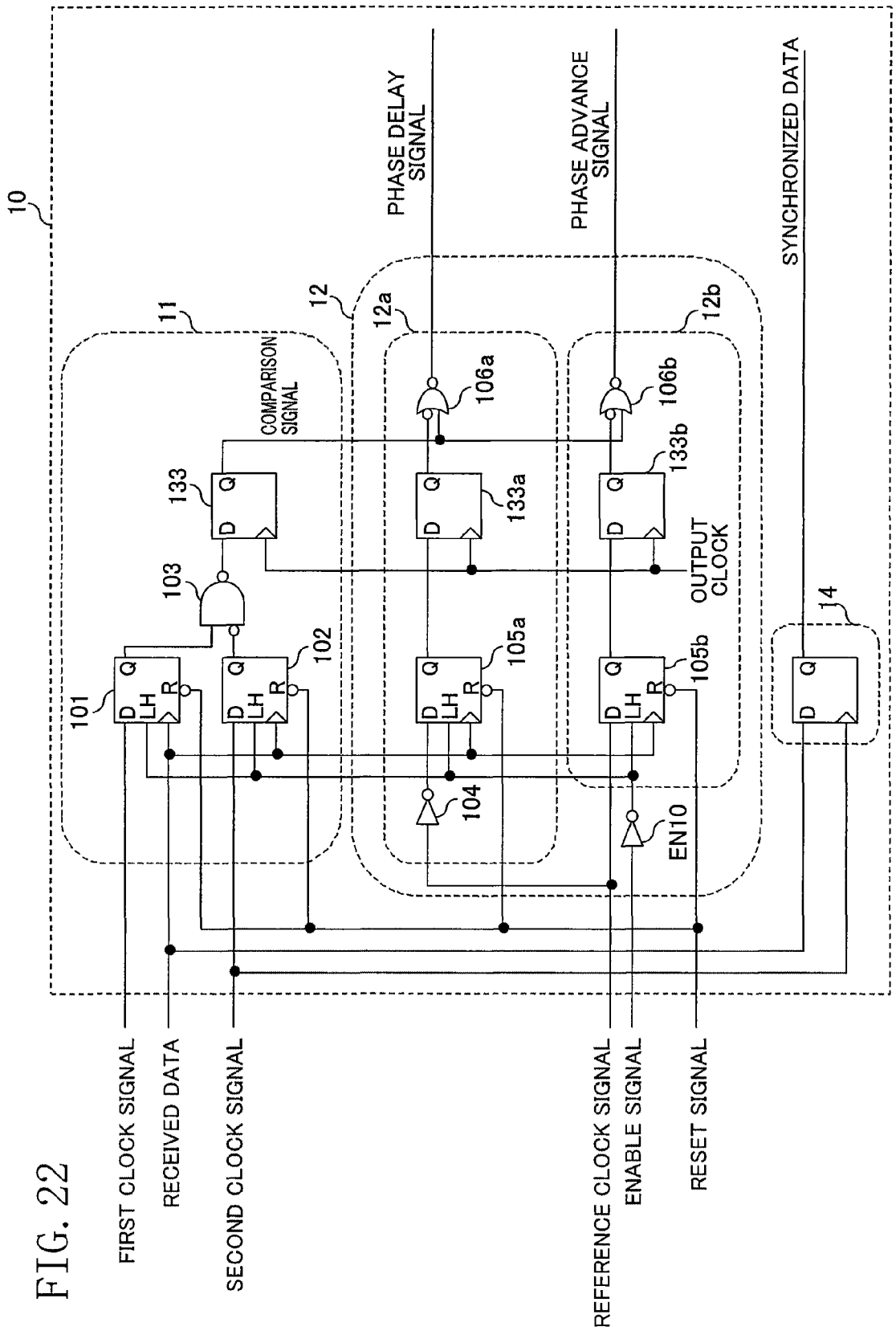
FIG. 22 is a circuit diagram for describing a variation of the phase comparator of FIG. 3.
Figure 23:
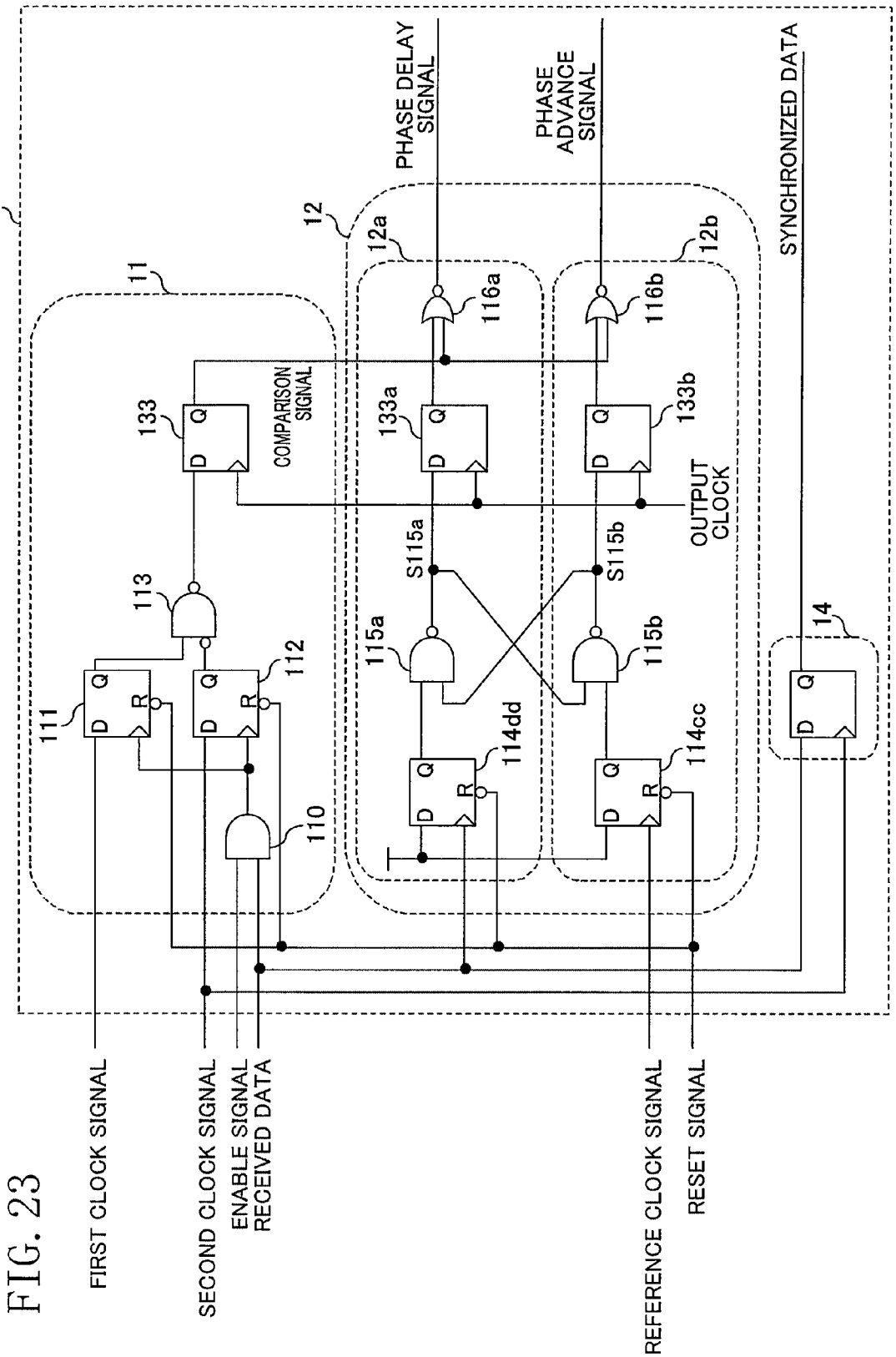
FIG. 23 is a circuit diagram for describing a variation of the phase comparator of FIG. 7.
Figure 24:
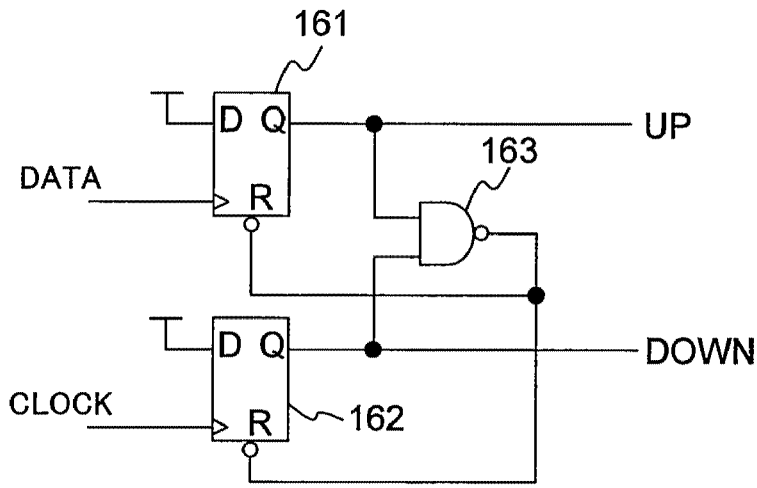
FIG. 24 is a circuit diagram showing a configuration of a conventional phase comparator.
Figure 25:
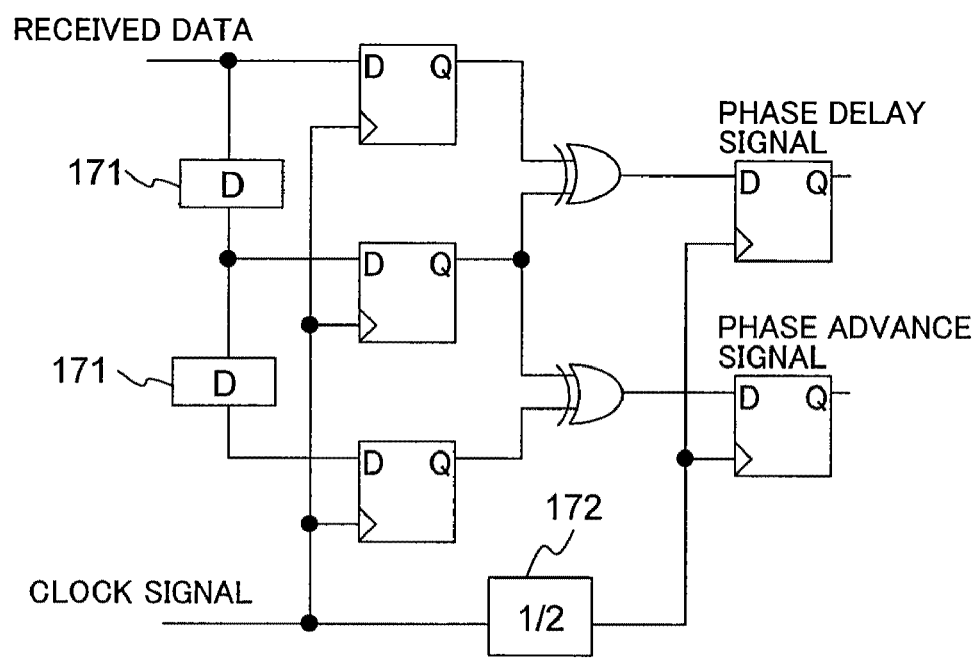
FIG. 25 is a circuit diagram showing a configuration of a conventional phase comparator.

The comparison signal holding unit 133 holds a comparison signal from the comparison period detecting unit 11 (the output of a logic circuit 103 in FIG. 22, and the output of a logic circuit 113 in FIG. 23). The phase delay detection holding unit 133a holds the result of detection of the phase delay detecting unit 12a (the output of a flip-flop 105a of FIG. 22, and a first internal signal S115a in FIG. 23). The phase advance detection holding unit 133b holds the result of detection of the phase advance detecting unit 12b (the output of the flip-flop 105b in FIG. 22, and a second internal signal S115b in FIG. 23). Note that the comparison signal holding unit 133, the phase delay detection holding unit 133a, and the phase advance detection holding unit 133b are applicable not only to the phase comparator 10 of FIGS. 3 and 7, but also to the phase comparators of the second embodiment (FIGS. 8 and 10), the third embodiment (FIGS. 11 and 13) and the fourth embodiment (FIG. 15).

(Reference Clock Signal and Delayed Reference Clock Signal)

As can be seen from the description above, in the first embodiment, a phase control is performed so that a reference clock signal and a data transition point have the same timing. Also, in the second embodiment, the start point of a dead zone of the phase comparator 10 is defined by a reference clock signal, while the end point of the dead zone is defined by a delayed reference clock signal, and a phase control is performed so that a data transition point falls within the dead zone. Moreover, in the third embodiment, the end point of the dead zone of the phase comparator 10 is defined by a reference clock signal, while the range of the dead zone is defined by the delay amount of received data.

Also in the first to third embodiments, the end point of a comparison period (a rising edge of a second clock signal) is utilized as a data latch timing. In theory, a period from a convergence point of a phase control (a rising edge of a reference clock signal in the first embodiment, and the inside of a dead zone in the second and third embodiments) to the data latch timing, preferably has a length that can satisfy a setup constraint and a hold constraint on a flip-flop that is the reception unit 14. With such a configuration, received data can be correctly held, and can be output as accurate synchronized data.

In the fourth embodiment, the start point of a dead zone of the phase comparator 10 is defined by the start point of a comparison period (i.e., a rising edge of a second clock signal), while the end point of the dead zone is defined by the start point of the next comparison period (i.e., a rising edge of the next first clock signal), and a phase control is performed so that a data transition point is provided at a position that is located a predetermined period away from a reference clock signal.

Also, in the fourth embodiment, a reference clock signal is utilized as the data latch timing. In theory, a period from the start point of a comparison period (i.e., a rising edge of a first clock signal) to a rising edge of the reference clock signal, preferably has a length that can satisfy a setup constraint on a flip-flop that is the reception unit 14, and a period from a rising edge of the reference clock signal to the end point of the comparison period (i.e., a rising edge of a second clock signal), preferably has a length that can satisfy a hold constraint. With such a configuration, it is possible to correctly hold received data and output the received data as accurate synchronized data.

Also, in a clock data recovery system, when a phase control amount has a discrete value, it is difficult to cause a transition point of received data and a convergence point of a phase control to perfectly coincide with each other. Also, it is also necessary to correctly hold received data during a period from when the transition point of the received data is deviated from the convergence point of the phase control due to jitter or the like to when the phase control works. It is preferable to set a reference clock signal or a delayed reference clock signal in view of the intensity of jitter occurring in actual communication or the like. For example, in communication in which high-frequency jitter is likely to occur, the phase difference of clock signals is preferably set so that the dead zone of the phase comparator 10 is broadened. In communication in which low-frequency jitter is likely to occur, the phase difference of clock signals is preferably set so that the dead zone is narrowed.

There is also a communication protocol that includes a calibration period for reducing communication error. As such a communication protocol, communication via a modem is commonly used, for example. In such a communication protocol, a specific data pattern is transmitted during a calibration period, and based on the data pattern, an operation mode of a receiver apparatus is determined or a process for causing a circuit operation to converge to a stable point is performed. Thus, data whose format is previously known is transmitted form a transmitter apparatus, and a period during which the data is received is set in a receiver apparatus. In this case, received data held in the reception unit 14 is monitored during the reception period, and when expected data has not been received, the phase of a reference clock signal is shifted in a direction that relaxes a setup/hold margin of the reception unit 14, thereby making it possible to achieve clock data recovery system resistant to jitter.

Also, obviously, during a normal communication period other than the calibration period, a similar control can be performed by monitoring an error correction code included in communication data or a specific code regularly transmitted. As the error correction code, the CRC code included in the IEEE1394a protocol is well known. This code has a format in which the n least significant bits are inversion of the n most significant bits. Also, in the IEEE1394b protocol, a specific bit sequence called a comma pattern is transmitted at constant intervals. By utilizing such a property of the communication protocol to adaptively control the phase difference of a clock signal (a period setting clock signal, a reference clock signal, etc.), a clock data recovery system resistant to noise, such as jitter or the like, can be achieved.

INDUSTRIAL APPLICABILITY

The present invention is applicable to a phase comparator, a clock data recovery system and the like, and is useful as a technique applicable to high-speed data communication.

The invention claimed is:

1. A phase comparator comprising:
   a comparison period detecting unit for receiving a data signal of data having a one-bit length of T, a first clock signal having a period of nT (n is an integer of 2 or more), and a second clock signal having a period of nT and a phase delayed by h (0<h≦1 T) from the first clock signal, defining, as a comparison period, a period between a rising edge of the first clock signal and a rising edge of the second clock signal, and detecting the presence or absence of transition of the data signal during the comparison period; and
   a phase relationship detecting unit for receiving the data signal, and a reference clock signal having a period of nT and a phase delayed by i (0<i<h) from the first clock signal, detecting a phase relationship between the data signal and the reference clock signal, and outputting a result of detection of the phase relationship when transition of the data signal is detected by the comparison period detecting unit during the comparison period.

2. The phase comparator of claim 1, wherein
the second clock signal has a phase delayed by 1 T from the first clock signal and is a clock indicating a timing at which the data signal is latched, and
the phase relationship detecting unit includes:
   a phase delay detecting unit for outputting a phase delay signal when a rising edge of the reference clock signal occurs in time after transition of the data signal and transition of the data signal is detected by the comparison period detecting unit during the comparison period; and
   a phase advance detecting unit for outputting a phase advance signal when a rising edge of the reference clock signal occurs in time before transition of the data signal and transition of the data signal is detected by the comparison period detecting unit during the comparison period.

3. The phase comparator of claim 2, wherein
the phase delay detecting unit includes:
   a first holding unit for holding an inverted signal of the reference clock signal in synchronization with transition of the data signal; and
   a phase delay signal output unit for outputting a result held by the first holding unit as the phase delay signal when transition of the data signal is detected by the comparison period detecting unit during the comparison period, and
the phase advance detecting unit includes:
   a second holding unit for holding the reference clock signal in synchronization with transition of the data signal; and
   a phase advance signal output unit for outputting a result held by the second holding unit as the phase advance signal when transition of the data signal is detected by the comparison period detecting unit during the comparison period.

4. The phase comparator of claim 2, wherein
the phase delay detecting unit includes:
   a transition point detecting unit for detecting transition of the data signal;
   a first output unit for outputting a first internal signal, depending on a timing at which transition of the data signal is detected by the transition point detecting unit; and
   a phase delay signal output unit for outputting the phase delay signal when the first output unit outputs the first internal signal and the comparison period detecting unit detects transition of the data signal during the comparison period, the phase advance detecting unit includes:
  a reference point detecting unit for detecting a rising edge of the reference clock signal;
  a second output unit for outputting a second internal signal, depending on a timing at which a rising edge of the reference clock signal is detected by the reference point detecting unit; and
  a phase advance signal output unit for outputting the phase advance signal when the second output unit outputs the second internal signal and the comparison period detecting unit detects transition of the data signal during the comparison period,
the first output unit outputs the first internal signal when the transition point detecting unit detects transition of the data signal in time before the reference point detecting unit detects a rising edge of the reference clock signal, and
the second output unit outputs the second internal signal when the transition point detecting unit detects transition of the data signal in time after the reference point detecting unit detects a rising edge of the reference clock signal.

5. The phase comparator of claim 1, wherein
the second clock signal has a phase delayed by 1 T from the first clock signal and is a clock indicating a timing at which the data signal is latched, and
the phase relationship detecting unit includes:
  a phase delay detecting unit for outputting a phase delay signal when a rising edge of the reference clock occurs in time after transition of the data signal and the comparison period detecting unit detects transition of the data signal during the comparison period; and
  a phase advance detecting unit for outputting a phase advance signal when a rising edge of a delayed reference clock signal having a phase delayed by D ($0<D<1$ T-i) from the reference clock signal occurs in time before transition of the data signal and the comparison period detecting unit detects transition of the data signal during the comparison period.

6. The phase comparator of claim 5, wherein
the phase delay detecting unit includes:
  a first holding unit for holding an inverted signal of the reference clock signal in synchronization with transition of the data signal; and
  a phase delay signal output unit for outputting a result held by the first holding unit as the phase delay signal when the comparison period detecting unit detects transition of the data signal during the comparison period, and
the phase advance detecting unit includes:
  a second holding unit for holding the delayed reference clock signal in synchronization with transition of the data signal; and
  a phase advance signal output unit for outputting a result held by the second holding unit as the phase advance signal when the comparison period detecting unit detects transition of the data signal during the comparison period.

7. The phase comparator of claim 5, wherein
the phase delay detecting unit includes:
  a reference point detecting unit for detecting a rising edge of the reference clock signal;
  a transition point detecting unit for detecting transition of the data signal;
  a first output unit for outputting a first internal signal when the transition point detecting unit detects transition of a data signal in time before the reference point detecting unit detects a rising edge of the reference clock signal; and
  a phase delay signal output unit for outputting the phase delay signal when the first output unit outputs the first internal signal and the comparison period detecting unit detects transition of the data signal during the comparison period, and
the phase advance detecting unit includes:
  a delayed reference point detecting unit for detecting a rising edge of the delayed reference clock signal;
  a second output unit for outputting a second internal signal when the delayed reference point detecting unit detects a rising edge of the delayed reference clock signal in time before the transition point detecting unit detects transition of the data signal; and
  a phase advance signal output unit for outputting the phase advance signal when the second output unit outputs the second internal signal and the comparison period detecting unit detects transition of the data signal during the comparison period.

8. The phase comparator of claim 1, wherein
the second clock signal has a phase delayed by 1 T from the first clock signal and is a clock indicating a timing at which the data signal is latched, and
the phase relationship detecting unit includes:
  a phase delay detecting unit for outputting a phase delay signal when a rising edge of the reference clock signal occurs in time after transition of a delayed data signal delayed by D ($0<D<i$) from the data signal and the comparison period detecting unit detects transition of the data signal during the comparison period; and
  a phase advance detecting unit for outputting a phase advance signal when a rising edge of the reference clock signal occurs in time before transition of the data signal and the comparison period detecting unit detects transition of the data signal during the comparison period.

9. The phase comparator of claim 8, wherein
the phase delay detecting unit includes:
  a first holding unit for holding an inverted signal of the reference clock signal in synchronization with transition of the data signal;
  a delay holding unit for holding the inverted signal of the reference clock signal in synchronization with transition of the delayed data signal;
  a first output unit for outputting a logical AND of results held by the first holding unit and the delay holding unit; and
  a phase delay signal output unit for outputting the output of the first output unit as the phase delay signal when the comparison period detecting unit detects transition of the data signal during the comparison period, and
the phase advance detecting unit includes:
  a second holding unit for holding the reference clock signal in synchronization with transition of the data signal; and
  a phase advance signal output unit for outputting a result held by the second holding unit as the phase advance signal when the comparison period detecting unit detects transition of the data signal during the comparison period.

10. The phase comparator of claim 8, wherein
the phase delay detecting unit includes:
  a reference point detecting unit for detecting a rising edge of the reference clock signal;

a transition point detecting unit for detecting transition of the data signal;

a delayed transition point detecting unit for detecting transition of the delayed data signal;

a phase delay predicting unit for outputting a phase delay prediction signal when the transition point detecting unit detects transition of the data signal in time before the reference point detecting unit detects a rising edge of the reference clock signal;

a first output unit for outputting a first internal signal when the delayed transition point detecting unit detects transition of the delayed data signal in time before the reference point detecting unit detects a rising edge of the reference clock signal; and a phase delay signal output unit for outputting the phase delay signal when the phase delay predicting unit outputs a phase delay prediction signal, the first output unit outputs the first internal signal, and the comparison period detecting unit detects transition of the data signal during the comparison period, and the phase advance detecting unit includes:

a second output unit for outputting a second internal signal when the reference point detecting unit detects a rising edge of the reference clock signal in time before the transition point detecting unit detects transition of the data signal; and a phase advance signal output unit for outputting the phase advance signal when the second output unit outputs the second internal signal and the comparison period detecting unit detects transition of the data signal during the comparison period.

11. The phase comparator of claim 1, wherein the reference clock signal is a clock indicating a timing at which the data signal is latched, and
the phase relationship detecting unit includes:

a phase delay detecting unit for outputting a phase delay signal when a rising edge of the reference clock signal occurs in time before transition of the data signal and the comparison period detecting unit detects transition of the data signal during the comparison period; and a phase advance detecting unit for outputting a phase advance signal when a rising edge of the reference clock signal occurs in time after transition of the data signal and the comparison period detecting unit detects transition of the data signal during comparison period.

12. The phase comparator of claim 11, wherein the phase delay detecting unit includes:

a reference point detecting unit for detecting a rising edge of the reference clock signal;

a first output unit for outputting a first internal signal, depending on a timing at which the reference point detecting unit detects a rising edge of the reference clock signal; and a phase delay signal output unit for outputting the phase delay signal when the first output unit outputs the first internal signal and the comparison period detecting unit detects transition of the data signal during comparison period, the phase advance detecting unit includes:

a transition point detecting unit for detecting transition of the data signal;

a second output unit for outputting a second internal signal, depending on a timing at which the transition point detecting unit detects transition of the data signal; and a phase advance signal output unit for outputting the phase advance signal when the second output unit outputs the second internal signal and the comparison period detecting unit detects transition of the data signal during comparison period, the first output unit outputs the first internal signal when the transition point detecting unit detects transition of the data signal in time after the reference point detecting unit detects a rising edge of the reference clock signal, and the second output unit outputs the second internal signal when the transition point detecting unit detects transition of the data signal in time before the reference point detecting unit detects a rising edge of the reference clock signal.

13. The phase comparator of claim 5, wherein the reference clock signal has a phase delayed by 0.25 T from the first clock signal, and
the delayed reference clock signal has a phase delayed by 0.5 T from the reference clock signal.

14. The phase comparator of claim 8, wherein the reference clock signal has a phase delayed by 0.75 T from the first clock signal, and
the delayed data signal has a phase delayed by 0.5 T from the data signal.

15. The phase comparator of claim 11, wherein the reference clock signal has a phase delayed by 0.25 T from the first clock signal, and
the second clock signal has a phase delayed by 0.5 T from the first clock signal.

16. A phase comparison device for performing phase comparison with respect to a data signal of data having a one-bit length of T (T<0), using m (m is an integer, $2 \leq m \leq n$) first clock signals having a period of nT (n is an integer, $n \geq 2$) and a phase difference of a multiple of 1 T between adjacent signals, m second clock signals corresponding to the m first clock signals and having phases delayed by h ($0 < h \leq 1$ T) from the corresponding first clock signals, and m reference clock signals corresponding to the m first clock signals and having phases delayed by i ($0 < i < h$) from the corresponding first clock signals, the device comprising:

m comparison period detecting units for receiving the data signal, a p-th (p is an integer, $1 \leq p \leq m$) one of the m first clock signals, and a p-th one of the m second clock signals, defining, as a p-th comparison period, a period between a rising edge of the p-th first clock signal and a rising edge of the p-th second clock signal, and detecting the presence or absence of transition of the data signal during the p-th comparison period; and m phase relationship detecting units for receiving the data signal and a p-th one of the m reference clock signals, detecting a phase relationship between the data signal and the p-th reference clock signal, and outputting a result of detection of phase comparison as a p-th phase detection result when a p-th one of the m comparison period detecting units detects transition of the data signal during the p-th comparison period.

17. The phase comparison device of claim 16, wherein the second clock signals received by the m comparison period detecting units are clocks indicating timings at which the data signal is latched, and
a p-th one of the m phase relationship detecting units includes:

a phase delay detecting unit for outputting a phase delay signal when a rising edge of the reference clock signal occurs in time after transition of the data signal and the p-th comparison period detecting unit detects transition of the data signal during the p-th comparison period; and a phase advance detecting unit for outputting a phase advance signal when a rising edge of the p-th reference clock signal occurs in time before transition of the data signal and the p-th comparison period detecting unit detects transition of the data signal during the p-th comparison period.

18. The phase comparison device of claim 16, wherein the second clock signals received by the m comparison period detecting units are clocks indicating timings at which the data signal is latched, and a p-th one of the m phase relationship detecting units includes:

a phase delay detecting unit for outputting a phase delay signal when a rising edge of the p-th reference clock signal occurs in time after transition of the data signal and the p-th comparison period detecting unit detects transition of the data signal during the p-th comparison period; and a phase advance detecting unit for outputting a phase advance signal when a rising edge of a p-th delayed reference clock signal having a phase delayed by D ($0<D<1$ T-i) from the p-th reference clock signal occurs in time before transition of the data signal and the p-th comparison period detecting unit detects transition of the data signal during the p-th comparison period.

19. The phase comparison device of claim 16, wherein the second clock signals received by the m comparison period detecting units are clocks indicating timings at which the data signal is latched, and a p-th one of the m phase relationship detecting units includes:

a phase delay detecting unit for outputting a phase delay signal when a rising edge of the p-th reference clock signal occurs in time after transition of a delayed data signal delayed by D ($0<D<i$) from the data signal and the p-th comparison period detecting unit detects transition of the data signal during the p-th comparison period; and a phase advance detecting unit for outputting a phase advance signal when a rising edge of the p-th reference clock signal occurs in time before transition of the data signal and the p-th comparison period detecting unit detects transition of the data signal during the p-th comparison period.

20. The phase comparison device of claim 16, wherein the reference clock signals received by the m phase relationship detecting units are clocks indicating timings at which the data signal is latched, and a p-th one of the m phase relationship detecting units includes:

a phase delay detecting unit for outputting a phase delay signal when a rising edge of the p-th reference clock signal occurs in time before transition of the data signal and the p-th comparison period detecting unit detects transition of the data signal during the p-th comparison period; and a phase advance detecting unit for outputting a phase advance signal when a rising edge of the p-th reference clock signal occurs in time after transition of the data signal and the p-th comparison period detecting unit detects transition of the data signal during the p-th comparison period.

21. A clock data recovery system comprising:

a clock generating unit for generating a plurality of main clocks having a period of nT (n is an integer, $n \geq 2$) and different phases with respect to a data signal of data having a one-bit length of T ($0<T$);

a multi-phase clock selecting unit for selecting, from the plurality of main clocks generated by the clock generating unit, m (m is an integer, $2 \leq m \leq n$) first clock signals having a phase difference of a multiple of 1 T between adjacent signals, and m reference clock signals corresponding to the m first clock signals and having phases delayed by i ($0<i<h$, $0<h \leq 1$ T) from the corresponding first clock signals;

a first phase comparing unit for receiving an externally input data signal, the m first clock signals and the m reference clock signals selected by the multi-phase clock selecting unit, and m second clock signals corresponding to the m first clock signals and having phases delayed by h from the corresponding first clock signals, and outputting m phase detection results; and a phase control unit for adjusting phases of clock signals selected by the multi-phase clock selecting unit, based on the m phase detection results from the phase comparing unit, wherein the first phase comparing unit includes:

m comparison period detecting units for receiving the data signal, a p-th one of the m first clock signals, and a p-th one of the m second clock signals, defining, as a p-th comparison period, a period between a rising edge of the p-th first clock signal and a rising edge of the p-th second clock signal, and detecting the presence or absence of transition of the data signal during the p-th comparison period; and m phase relationship detecting units for receiving the data signal and a p-th one of the m reference clock signals, detecting a phase relationship between the data signal and the reference clock signal, and outputting a result of detection of phase comparison as a p-th phase detection result when a p-th one of the m comparison period detecting units detects transition of the data signal during the p-th comparison period.

22. The clock data recovery system of claim 21, further comprising:

a second phase comparing unit including k (k is an integer, $2 \leq k \leq m$) of the m comparison period detecting units and k of the m phase relationship detecting units corresponding to the k comparison period detecting units, wherein the m comparison period detecting units and the m phase relationship detecting units included in the first phase comparing unit each operate in response to one of a rising edge and a falling edge of the data signal, the k comparison period detecting units and the k phase relationship detecting units included in the second phase comparing unit each operate in response to the other of the rising edge and the falling edge of the data signal, and the phase control unit sets phases of clock signals selected by the multi-phase clock selecting unit, based on m phase detection results from the first phase comparing unit and k phase detection results from the second phase comparing unit.

* * * * *